(12) United States Patent (10) Patent No.: US 8,773,827 B2
Kiko (45) Date of Patent: Jul. 8, 2014

(54) INTELLIGENT CIRCUIT BREAKER APPARATUS AND METHODS

(75) Inventor: Frederick J. Kiko, Carlsbad, CA (US)

(73) Assignee: Simply Automated Incorporated, Carlsbad, CA (US)

( * ) Notice: Subject to any disclaimer, the term of this patent is extended or adjusted under 35 U.S.C. 154(b) by 948 days.

(21) Appl. No.: 12/217,788

(22) Filed: Jul. 8, 2008

(65) Prior Publication Data

US 2009/0206059 A1 Aug. 20, 2009

Related U.S. Application Data

(60) Provisional application No. 61/066,324, filed on Feb. 19, 2008.

(51) Int. Cl.
*H02H 3/00* (2006.01)
*H02H 7/00* (2006.01)
*H02H 5/04* (2006.01)

(52) U.S. Cl.
USPC ............... 361/62; 361/2; 361/42; 340/310.11

(58) Field of Classification Search
USPC .......................................................... 361/42
See application file for complete search history.

(56) References Cited

U.S. PATENT DOCUMENTS

| | | |
|---|---|---|
| 4,467,434 A | 8/1984 | Hurley et al. |
| 4,701,698 A | 10/1987 | Karlsson et al. |
| 4,754,162 A | 6/1988 | Kondou et al. |
| 5,196,982 A | 3/1993 | Landsberg et al. |
| 5,617,286 A | 4/1997 | Jenkins |
| 5,629,869 A | 5/1997 | Johnson et al. |
| 5,982,596 A | 11/1999 | Spencer et al. |
| 6,067,483 A | 5/2000 | Fesmire et al. |
| 6,121,886 A | 9/2000 | Andersen |
| 6,141,197 A | 10/2000 | Kim et al. |
| 6,195,243 B1 | 2/2001 | Spencer et al. |
| 6,246,928 B1 | 6/2001 | Louis et al. |
| 6,292,717 B1 | 9/2001 | Alexander et al. |
| 6,356,426 B1 | 3/2002 | Dougherty |
| 6,507,255 B1 | 1/2003 | Ennis et al. |
| 6,671,148 B2 | 12/2003 | Evans et al. |
| 6,787,937 B2 | 9/2004 | Modey et al. |
| 6,836,099 B1 | 12/2004 | Amarillas et al. |
| 6,924,445 B2 | 8/2005 | Bresciani et al. |
| 6,952,335 B2 | 10/2005 | Huang et al. |
| 6,988,375 B2 | 1/2006 | Bashark |
| 7,019,606 B2 | 3/2006 | Williams et al. |
| 7,043,380 B2 | 5/2006 | Rodenberg, III et al. |

(Continued)

OTHER PUBLICATIONS

Universal Powerline Bus: The UPB System Description, Version 1.1 Sep. 19, 2003, Powerline Control Systems, 19201 Parthenia Street, Suite J, Northridge, CA.

*Primary Examiner* — Jared Fureman
*Assistant Examiner* — Lucy Thomas
(74) *Attorney, Agent, or Firm* — Gazdzinski & Associates, PC

(57) ABSTRACT

A system and associated components for providing an intelligent circuit breaker being adapted to communicate with, monitor and control various devices within a commercial or residential premises. In one embodiment, the system is adapted for low cost, ease of installation and operation, and ease of manufacture. The intelligent circuit breaker may also be adapted to send data relating to sensed parameter or conditions to, and receive commands from, a user interface. Methods for operating such breakers and converting existing circuit breakers to intelligent circuit breakers consistent with the aforementioned system and components are also described.

21 Claims, 17 Drawing Sheets

(56) References Cited

U.S. PATENT DOCUMENTS

| | | |
|---|---|---|
| 7,279,651 B1 | 10/2007 | Nguyen |
| 7,342,474 B2 | 3/2008 | Castonguay et al. |
| 7,400,239 B2 | 7/2008 | Kiko et al. |
| 7,657,763 B2 * | 2/2010 | Nelson et al. ............ 713/300 |
| 7,701,679 B2 * | 4/2010 | Brochu et al. ............ 361/42 |
| 2002/0101695 A1 | 8/2002 | Saksa |
| 2005/0125083 A1 | 6/2005 | Kiko |
| 2005/0257050 A1 | 11/2005 | Gierens et al. |
| 2006/0065510 A1 | 3/2006 | Kiko et al. |
| 2007/0008076 A1 | 1/2007 | Rodgers et al. |
| 2007/0016311 A1 * | 1/2007 | Bergman et al. ............ 700/19 |
| 2007/0155349 A1 * | 7/2007 | Nelson et al. ............ 455/128 |
| 2008/0167755 A1 | 7/2008 | Curt |

* cited by examiner

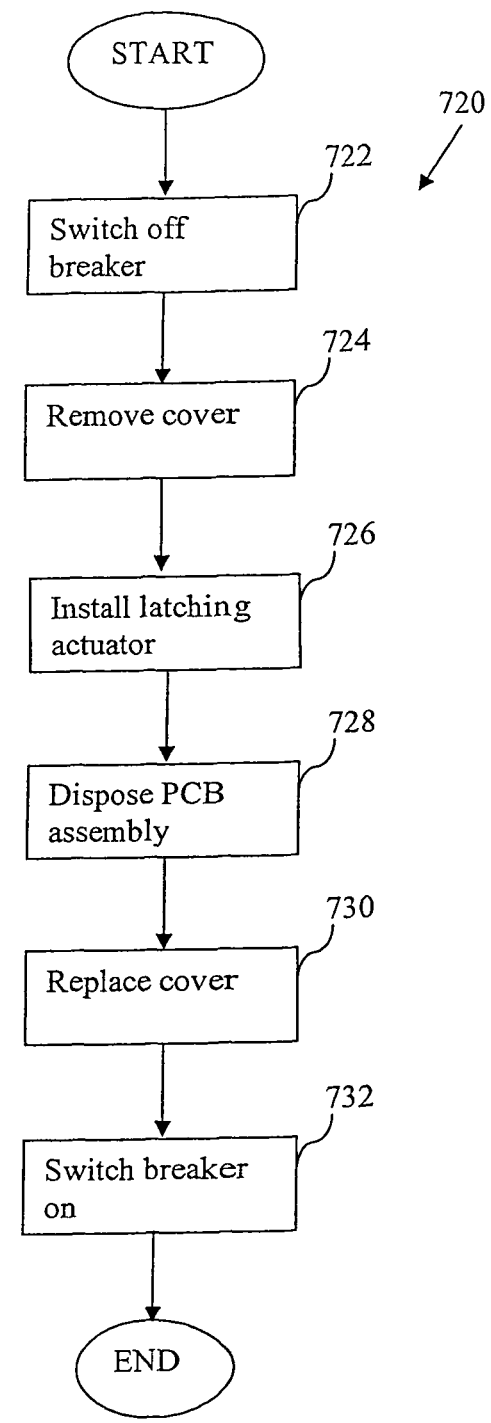

INTELLIGENT CIRCUIT BREAKER APPARATUS AND METHODS

PRIORITY

This application claims priority to co-owned and co-pending U.S. patent application Ser. No. 61/066,324, filed Feb. 19, 2008, and entitled "Intelligent Circuit Breaker Apparatus and Methods", which is incorporated herein by reference in its entirety.

COPYRIGHT

A portion of the disclosure of this patent document contains material which is subject to copyright protection. The copyright owner has no objection to the facsimile reproduction by anyone of the patent document or the patent disclosure, as it appears in the Patent and Trademark Office patent files or records, but otherwise reserves all copyright rights whatsoever.

BACKGROUND OF THE INVENTION

1. Field of the Invention

The present invention relates generally to the field of electric power distribution, and specifically in one exemplary aspect to an automated power measuring circuit breaker for use in a home, office, or other premises by a consumer, homeowner, or a public utility.

2. Description of Related Technology

Traditional circuit breakers automatically operate as electronic switches which are adapted to protect electrical circuits from damage due to overloading or short circuiting. Generally, a circuit breaker detects a current fault condition and subsequently causes contacts within the circuit breaker to open thereby interrupting the circuit. An arc is generated when the current is interrupted. The arc must be contained, cooled, and extinguished in a controlled way, so that the gap between the contacts can again withstand the voltage in the circuit. When the fault condition is corrected, the contacts are reclosed manually and power is restored to the interrupted circuit.

Various mechanisms for controlling the closing and opening circuits in a circuit breaker during fault conditions are known in the prior art, including actuators, solid-state circuits, latches, etc. For example, U.S. Pat. No. 6,924,445 to Bresciani et al. issued Aug. 2, 2005 and entitled "Low-voltage circuit breaker" discloses a low-voltage circuit breaker, comprising: at least one first fixed contact, which is electrically connected to a terminal for connection to an electric circuit; a rotating moving contact, which comprises a central body from which at least one first arm protrudes, an active surface being provided at the end of the first arm, the active surface being associable/separable with respect to the fixed contact by means of a rotation of the moving contact; a rotating contact supporting shaft, which is functionally connected to an actuation mechanism of the circuit breaker and is provided with a seat that accommodates the central body of the moving contact so that the first arm protrudes externally from the seat, at least one first spring being furthermore arranged in the contact supporting shaft and being functionally coupled to the moving contact and suitable to ensure, when the circuit breaker is closed, an adequate contact pressure between the active surface and the first fixed contact; its particularity consists of the fact that at least one first abutment surface is provided on the central body of the moving contact and is suitable to act, during a rotation of the moving contact caused by a short-circuit, against a complementarily shaped surface formed in the seat of the shaft, so that at least part of the energy accumulated by the rotating moving contact during its rotation is transmitted directly to the shaft.

U.S. Pat. No. 6,952,335 to Huang et al. issued Oct. 4, 2005 and entitled "Solid-state DC circuit breaker" discloses a high-speed, solid-state circuit breaker capable of interrupting high DC currents without generating an arc, which is maintenance-free. Both the switch and the tripping unit are solid-state, which meet precise protection requirements. The high-speed, solid-state DC circuit breaker uses an emitter turn-off (ETO) thyristor as the switch. The ETO thyristor has an anode, a cathode and first, second and third gate electrodes. The anode is connectable to a source of DC current, and the cathode is connectable to a load. A solid-state trip circuit is connected to the first, second and third gate electrodes for controlling interruption of DC current to the load by turning off said ETO thyristor.

U.S. Pat. No. 7,279,651 to Nguyen issued Oct. 9, 2007 and entitled "Automatic shut-off switch for main power source" discloses an automatic turn-off switch responsive to displacement of a movable element placed on a seat which resides on the top of a chute located with an opening at the bottom immediately adjacent to a pivotal lever. A spring-loaded latch is normally biased in a contracted condition. An automatic release is cooperatively carried between the spring latch and the lever whereby displacement of the mechanical movable element causes the release to disconnect from the contracted latch, whereby the latch is released for forcible engagement with a conventional on/off switch in a circuit breaker box. When the circuit breaker switch is in the "on" position, the released latch engages the switch and causes the switch to move to its "off" position, terminating all electrical communication with the main power source.

Collection of data regarding fault conditions is also given in the prior art. For example, in U.S. Pat. No. 5,196,982 to Landsberg et al. issued Mar. 23, 1993 and entitled "Electrical power monitoring system" a method and system incorporating an integral power consumption monitor-circuit breaker panel for industrial or commercial buildings and facilities is disclosed. The power consumption monitor-circuit breaker panel not only protects each end use within the building against harmful overloads, but also monitors peak power demands of each end use. Electrical current, voltage and phase information is provided by each monitor-breaker. This information is then fed to a processing circuit that provides a power consumption value. The power consumption value is then fed to recording device to provide a power consumption history for each end use. Each monitor-breaker is identified by its end use, as for example, by color coding. The monitor device of each circuit breaker is designed to provide a voltage that is proportional to the circuit load. Two methods may be used to provide such a voltage signal: a) the voltage signal can be developed across a built-in shunt in each circuit breaker; and b) a proportional voltage can be obtained by use of a circuit breaker with a built-in Hall effect device, wherein the product of the instantaneous current and voltage along with the phase angle between them, provides the power measurement. The current and/or instantaneous power information can be sent to the recording device via a powerline carrier, radio link, or optical fiber. The information can be integrated to provide either kW or kW/hr readings.

U.S. Pat. No. 6,836,099 to Amarillas et al. issued Dec. 28, 2004 and entitled "Electrical power conservation apparatus and method" discloses an electrical power control apparatus and method for a conventional 60 hertz or other conventional frequency electrical AC power supply voltage waveform to provide an effective output current and voltage to an intended load whereby the output frequency is the same as the input frequency. Using a switching means capable of micro switching the current on and off, and a plurality of substantially equal length and duration interruptions of current on both sides of an AC current oscillation, the output effective voltage and resulting current may be preset and controlled to a preprogrammed output level regardless of input voltage having one or more phases. Or, the output voltage and resulting current may be continually monitored with the load integrated into the circuit being monitored and continually adjusted to yield maximum power use savings while avoiding damage to the components attached to the circuit. Additional embodiments provide for use of the micro chopping device as a voltage regulator, motor controller, light dimmer, line conditioner, and also a circuit breaker for over current protection and as a smart circuit breaker to yield a data stream on individual circuit power usage which can be communicated to a monitoring station locally or by electronic transmission of information to a remote monitoring station. Real time monitoring and adjustment of power usage may be accomplished using such communication and two way communication between the device and communicating monitoring station also allow for real time charges for power usage and deduction from prepaid account for real time power usage.

U.S. Pat. No. 5,617,286 to Jenkins issued Apr. 1, 1997 and entitled "Circuit breaker having data recording" disclose an electronic circuit breaker having a micro-processor therein and at least one port or pin on the micro-processor which is used to produce an output pulse with time and/or frequency of the pulse related to the power characteristic being measured. This output pulse is thereafter transmitted to a recorder which is preferably a pulse data recorder or may be a data recorder.

U.S. Pat. No. 4,467,434 to Hurley et al. issued Aug. 21, 1984 and entitled "Solid state watt-hour meter" discloses a watt-hour meter which includes: a microprocessor coupled to a solid-state Hall-Effect sensor; an electrically alterable ROM coupled to the microprocessor; a power supply; a power outage timing means using the discharge characteristic of a capacitor; apparatus for supplying a 60 Hz clock signal to the microprocessor; a readout device coupled to the microprocessor to provide an indication of the power consumed; an output on the microprocessor for controlling a circuit breaker; and a switch for overriding the microprocessor controlled circuit breaker. The microprocessor and the electrically alterable ROM are connected and programmed: to sense the time of day as determined from an initial time of day and setting the 60 Hz clock signal; to sense and compute the power used by the consumer; to automatically open the circuit breaker when power demand on the electric power source is high and/or the cost per kilowatt hour is high; to automatically close the circuit breaker when the power demand on the source of electric power is low and/or the cost per kilowatt power is low; and to allow a consumer to override the microprocessor's control of the circuit breaker.

U.S. Pat. No. 6,292,717 to Alexander et al. issued Sep. 18, 2001 and entitled "Energy information device and graphical display for a circuit breaker" discloses an energy information system for use with a circuit breaker coupled between a power source and a load, the energy information system comprising: sensing apparatus for sensing at least one of i) a voltage, and ii) a current flowing between the power source and the load through the circuit breaker; detecting apparatus for detecting transitions of a sensed voltage; counting apparatus for counting a number of times the circuit breaker trips and interrupts the current flow between the power source and the load; measuring apparatus for i) measuring the current flow through the circuit breaker when the circuit breaker trips and interrupts the current flow between the power source and the load and ii) determining a plurality of energy related parameters including a measure of at least one of the voltage, the current and the frequency based on an output from the detecting apparatus, between the power source and the load; input apparatus for accepting a user input, the user input controlling at least one of the circuit breaker and a display apparatus; the display apparatus for displaying at least one of the plurality of conditions of the circuit breaker responsive to the input apparatus; and communication apparatus coupled to the input apparatus for selectively communicating at least one of the plurality of energy related parameters to a remote terminal.

Fault data collection may be used as given in U.S. Pat. No. 6,671,148 to Evans et al. issued Dec. 30, 2003 entitled "Electronic communicating residential circuit breaker" which discloses a system for communicating with a residential electrical load center, including a residential electrical wiring system and at least one electronic communicating circuit breaker. The electronic communicating circuit breaker includes a fuse protected communications and control module. The system provides power to the fuse protected communications and control module utilizing the residential electrical wiring system, and operates the electronic communicating circuit breaker utilizing the fuse protected communications and control module regardless of whether the electronic communicating circuit breaker is in an 'Open' or 'Closed' state.

Collected data may be used in mathematical operations as in U.S. Pat. No. 7,043,380 to Rodenberg, III, et al. issued May 9, 2006 and entitled "Programmable electricity consumption monitoring system and method", which discloses a programmable system for monitoring electricity consumption by a residence or business, including: (a) a Measuring Transmitting Unit integrated in a main circuit breaker or utility meter in the residence or business; comprising: (1) a means of receiving AC analog signals, converting the AC analog signals to DC analog signals, summing the DC analog signals, and outputting the information; (2) a microcontroller; (3) a power line carrier transmission interface controller; and (4) a power supply for powering the Measuring Transmitting Unit; and (b) a programmable Receiving Display Unit, comprising: (1) a power supply for powering the Receiving Display Unit; (2) a power plug; (3) a power line carrier transmission interface controller; (4) a data decoder; (5) a microcontroller; (6) memory associated with the microcontroller; (7) a visual display; and (8) a mechanism for inputting to the Receiving Display Unit; and wherein the Measuring Transmitting Unit translates current to digitally encoded signals, and transmits the signals over existing power circuits in the residence or business; and the Receiving Display Unit receives the signals, decodes them, and translates them for viewing. A method for monitoring electricity consumption by a residence or business is also included.

U.S. Pat. No. 6,121,886 to Anderson issued Sep. 19, 2000 and entitled "Method for predicting fault conditions in an intelligent electronic device" discloses a method of predicting an eminent circuit breaker trip condition using an intelligent electronic device such as a trip unit, a protective relay, a power meter or other IED is presented. The intelligent electronic device includes a microcontroller and associated memories. An algorithm (program) stored in a memory of the intelligent electronic device generates a near-trip event for each trip event calculation if preset thresholds for the measured parameters are breached.

Transmission of collected data to an external computer is disclosed in U.S. Pat. No. 6,197,243 to Spencer et al. issued Feb. 27, 2001 and entitled "Method and apparatus for adaptive configuration and control in a network of electronic circuit breakers", which discloses a system including a load center monitor connected to a plurality of digitally enhanced circuit breakers by a communication bus forming a network of reconfigurable circuit breakers which providing advanced monitoring and control of an electrical power distribution system. A user port and a service port provide a communication interface with an external computer. Visual indicators and an audible alarm provide for alerting persons to certain conditions in the system. Buttons are provided for CLEAR, RESET, and TEST functions, and a diagnostic port is also provided. The load center monitor is operable to monitor the operation of the circuit breakers and download information therefrom for storage in the load center monitor as in the form of historical data. Further, the load center monitor is operable to adaptively configure the trip profiles of individual circuit breakers in the network by uploading the alternate selection or revision to the trip profile to an individual circuit breaker in order to change the operation thereof.

Control of a circuit breaker from a remote device is given in, for example, U.S. Pat. No. 7,342,474 to Castonguay, et al. issued Mar. 11, 2008 and entitled "Circuit breaker configured to be remotely operated" which discloses a circuit breaker configured to be remotely operated. The circuit breaker includes a set of main contacts configured to connect between an electrical source and an electrical load, an operating mechanism in operable communication to open and close the main contacts, and a remotely operable drive system configured to open and close the main contacts separate from actuation of the operating mechanism. The drive system includes a motor responsive to first and second control signals, a primary drive responsive to the motor, and an opening spring responsive to the primary drive, the main contacts being responsive to the opening spring. In response to the first control signal, the primary drive moves to charge the opening spring, and in response to the second control signal and the main contacts being closed, the primary drive moves to allow the opening spring to discharge thereby resulting in the main contacts opening independent of the motor.

Also, U.S. Pat. No. 6,787,937 to Mody et al. issued Sep. 7, 2004 and entitled "Method of operating remote operated circuit breaker panel" discloses a remote operated device including: a plurality of circuit breakers; a first actuator in operable communication with a second actuator, the first actuator positions the second actuator at a circuit breaker of the plurality of circuit breakers, the second actuator mounted external to the plurality of circuit breakers, the second actuator moves a handle of the circuit breaker to an on position, an off position, or performs a reset operation; and a controller in electronic communication with the first actuator and the second actuator.

U.S. Pat. No. 6,246,928 to Louis et al. issued Jun. 12, 2001 and entitled "Electrical interruption device comprising a communication module" discloses an interruption device, circuit breaker or contactor, which comprises a communication module arranged in one of the locations designed for auxiliary contacts. The module is connected to the auxiliary contacts and to a communication bus to enable transmission of the states of the device to a supervision device, by means of the bus. The module can also act as interface between the bus and opening and closing control relays of the device, so as to enable remote control thereof by means of the bus.

U.S. Pat. No. 6,988,375 to Bashark issued Jan. 24, 2006 and entitled "System and method for remote appliance monitoring" discloses a device for monitoring a plurality of appliances, wherein each appliance is connected to an electrical circuit having a first wire and a second wire. The device includes a plurality of cores, each of the plurality of cores being constructed to be able to surround one of the first wires of each circuit and having a secondary winding at which an electrical signal is generated in response to a current polarity change in the first wire. A multiplexer is connected to the secondary winding of each of the plurality of cores. A processor is connected to the multiplexer to monitor the phase relationship between an AC voltage an AC current of each appliance connected to one of the plurality of circuits and to determine information relating to the function of the appliance based on the phase relationship. The device may be located at the circuit breaker box of an establishment.

U.S. Pat. No. 5,629,869 to Johnson et al. issued May 13, 1997 and entitled "Intelligent circuit breaker providing synchronous switching and condition monitoring" discloses an intelligent circuit breaker or switching device system comprising three separate microprocessor-based units, including a condition monitoring unit (CMU), a breaker control unit (BCU), and a synchronous control unit (SCU). The CMU provides detailed diagnostic information by monitoring key quantities associated with circuit breaker or switching device reliability. On-line analysis performed by the CMU provides information facilitating the performance of maintenance as needed and the identification of impending failures. The BCU is a programmable system having self-diagnostic and remote communications. The BCU replaces the conventional electromechanical control circuits typically employed to control a circuit breaker or switching device. The SCU provides synchronous switching control for both closing and opening the circuit interrupters. The control processes carried out by the SCU reduce system switching transients and interrupter wear. The intelligent circuit breaker or switching device system improves system operation and equipment maintenance.

U.S. Pat. No. 6,507,255 to Ennis et al. issued Jan. 14, 2003 and entitled "Remotely controllable circuit breaker" discloses a circuit breaker which has a set of remotely controllable secondary contacts electrically connected in series with the main contacts which provide overcurrent or fault current protection. An operating mechanism opens and closes the set of main contacts. The secondary contacts are opened and closed by a latching solenoid. The latching solenoid includes a plunger latchable to a first position, which opens the set of secondary contacts, and to a second position which closes the set of secondary contacts. The latching solenoid also includes an open/close coil which when energized with a first polarity signal operates the plunger to the first position and which when energized with an opposite second polarity signal operates the plunger to the second position. A circuit is structured for cooperation with a remote control circuit for energizing the coil with the first polarity signal or, alternatively, the second polarity signal.

As fuel costs and peak power demands increase, electric power shortage issues are raised, thus making home and business power management a necessity. In many instances, it has become necessary for homeowners, business owners, and/or public utilities to temporarily shed large non-necessary loads, such as, inter alia, water heaters, pool pumps, spas, dishwashers, and dryers during peak demand hours (i.e., 2-7 PM) so as to meet increased energy demands. Accordingly, public utilities have begun preparing to implement systems by which power consuming devices may be controlled remotely. Furthermore, the increased demands combined with increased fuel costs, etc. cause energy rates to continue to increase especially during peak periods (3-7 pm). Thus, homeowners and other consumers also have an interest in automating some or all of their devices, thereby reducing power consumption.

Thus, prior art circuit breakers able to control one or more devices with a timer; for example, U.S. Pat. No. 4,754,162 to Kondou, et al. issued Jun. 28, 1988 and entitled "Timer controlled multipole circuit breaker" discloses a timer controlled multipole circuit breaker which has a pair of breaker contacts in each pole which are connected to load and line terminals respectively provided in the current path of each pole. Incorporated in the breaker is electric timer for controlling to open and close the breaker contacts according to a predetermined timing schedule. The electric timer has its input end connected across the line terminals of the adjacent poles so as to be energized by the common power on the line terminals of the breaker without requiring any additional external wiring. The circuit breaker incorporating the electric timer of the present invention further provides a safeguard which inhibits the automatic reclosing of the contacts by the timer operation until the fault current condition is cleared.

U.S. Pat. No. 6,067,483 to Fesmire et al. issued May 23, 2000 and entitled "Electrical distribution computer" discloses an electrical distribution computer panel for delivering and controlling power to a plurality of electrical circuits. The electrical distribution computer includes a unitary enclosure having a top, bottom, sides and a door. Located within the enclosure is a microprocessor having a central processing unit, a clock for providing a clock signal to the central processing unit, memory for storing an application program for the central processing unit and a remote communication circuit for providing communications to the electrical distribution computer from a remote device. Also located in the enclosure is an interface having a plurality of outputs and a plurality of inputs communicably associated with the microprocessor and a plurality of computer controllable circuit breakers having a circuit breaker input for receiving a circuit breaker control signal from the interface. A display for displaying information provided by the microprocessor is located on an outer wall of the enclosure. The display includes a display input for receiving a display signal from the interface. A keypad including an output for providing information to the interface is also located on an outer wall of the enclosure.

The aforementioned load control requirements most greatly affect existing homes/systems, because it is in these systems where less-efficient devices are typically located. None of the aforementioned circuit breaker apparatus, methods and systems are adapted to communicate with and/or control operations of the various devices associated with the apparatus. Such communication and control being useful in enabling an exemplary system to utilize data collected for mathematical operations and/or diagnosis and inform the device and/or a user of a condition of the devices, as well as to implement one or more corrective measures. Hence, what is needed is an economic approach to load shedding and power management and associated apparatus and methods of operation. Such system and methods would also ideally be easily workable with existing systems, and would advantageously comprise features which would enable a user (i.e. a homeowner, consumer, or public utility) to gather information regarding the power requirements associated with a particular device and/or system of devices. It is also appreciated that existing technology, including the HomePlug® Power Alliance Command and Control technology (HPCC), may be utilized to implement whole house control via powerline-based home networks.

Exemplary systems and methods thus, would preferably be adapted to communicate with one or more devices associated with a circuit breaker and monitor and collect data regarding their operation. Collected data may be utilized for mathematical opertations, diagnostics and may be transmitted to external devices as well as to the devices associated with a circuit breaker. Accordingly, the external devices may be adapted to not only control the exemplary circuit breaker apparatus, but also the devices associated with the circuit breaker via the circuit breaker apparatus' ability to communicate with the devices. Further, the devices associated with the circuit breaker may be adapted to take corrective measures independent of user intervention.

Such system and methods would also ideally allow a user to perform the installation of the system themselves (or with minimal assistance), and also not require any significant modification to the premises infrastructure such as running cabling, electrical system modifications, drywall or plumbing work, etc. In other words, installation of an ideal system would be quickly and easily accomplished. Such system and methods would also take advantage of the fact that most of the significant loads are typically on separate breakers.

The ideal system would also be highly modular in nature, such that each user could configure their premises (and equipment operating therein) according to their particular desires and equipment configuration. This modularity would also include the ability to add more or different automation functions over time without having to modify the rest of the system.

SUMMARY OF THE INVENTION

The present invention satisfies the aforementioned needs by providing improved apparatus and methods for, inter alia, apparatus and methods for enabling a user (i.e. a homeowner, consumer or public utility) to monitor and control the power requirements of individual devices as well as of entire systems of devices.

In a first aspect of the invention, power supply apparatus utilized in a powerline (e.g., HPCC) system is disclosed. In one embodiment the power supply apparatus comprises 5V/3.3V circuitry. In one variant, the power supply apparatus comprises a transistor, zener diode and an opto-isolator with shunt resistor that provides both the 5V converter regulation as well as the 3.3V output.

In another embodiment, the power supply apparatus comprises a lower power supply without a tapped inductor. In one variant, the lower power supply apparatus comprises a 1 Watt power supply that uses a series capacitor with a Zener diode and rectifier to drop the input AC voltage to approximately 30V and a 30V low voltage converter to generate the 5V or 3.3V power.

In a second aspect of the invention, apparatus which combines power sensing with controlled breaker operation is disclosed. In one embodiment, the apparatus performs diagnostics on external appliances automatically. In one variant, the appliance diagnostic comprises detecting a dirty air filter. In another variant, the appliance diagnostic comprises detecting low Freon levels in an HVAC unit. In yet another variant, the apparatus comprises a user interface. In yet another variant, the apparatus is incorporated as part of an overall control system.

In a third aspect of the invention, actuator apparatus is disclosed. In one embodiment, the actuator apparatus comprises a latching actuator or arm adapted to push the breaker actuator contact arm open. The actuator apparatus obviates the necessity to add a relay.

In a fourth aspect of the invention, intelligent circuit breaker (ICB) apparatus is disclosed. In one embodiment, the ICB comprises control circuitry and a latching relay. In one variant, this is accomplished based in part on a standard breaker design. In a second embodiment, the ICB comprises control circuitry to the breaker plus a magnetically latching actuator. In another embodiment the actuator is mechanically latching.

In a fifth aspect of the invention, methods for installing the ICB are disclosed. In a first embodiment, the method comprises switching off the old breaker, loosening a black wire and pulling the wire from the breaker, removing the old breaker, replacing with the intelligent breaker, reinstalling the black wire in the intelligent breaker line terminal, and installing the white wire to the neutral bar.

In a sixth aspect of the invention, HPCC controller apparatus is disclosed. In one embodiment, the HPCC controller comprises an HPCC modem with a controller function and a transmit/receive coupling.

In a seventh aspect of the invention, power sensor apparatus is disclosed. In one embodiment, the power sensor apparatus is adapted to collect and store watt-hours usage.

In an eighth aspect of the invention, methods of doing business utilizing the aforementioned apparatus are disclosed.

In a ninth aspect of the invention, a computer readable medium comprising a plurality of executable instructions is disclosed. In one embodiment, the computer readable medium implements a series of algorithmic processing steps to perform diagnostics on appliances in communication with an ICB.

In a tenth aspect of the invention, methods of operating a circuit having an intelligent circuit breaker disposed therein are disclosed.

In an eleventh aspect of the invention, a circuit breaker apparatus is disclosed. In one embodiment, the apparatus comprises a power supply, a control module adapted to communicate with one or more powered devices operating on a circuit serviced by the breaker, at least one sensor apparatus adapted to transmit data regarding activity occurring on at least one of the one or more powered devices to the control module, and a plurality of mechanical components effecting a circuit breaking function. According to this embodiment, the control module is further adapted to evaluate the at least one of the one or more powered devices and control the at least one powered device based at least in part on the evaluation.

In one variant, the power supply comprises at least one of: (i) a transistor, Zener diode and an opto-isolator with shunt resistor that provides both a 5V converter regulation as well as a 3.3V output, or (ii) a power supply without a tapped inductor, the power supply comprising a series capacitor with a Zener diode and rectifier adapted to drop input AC voltage to approximately 30V and a 30V low voltage converter to generate power at a voltage less than 30V.

In another variant, the control module is adapted to communicate with and control the one or more powered devices via power lines associated with the devices. In one facet, the control module comprises a HomePlug Command and Control (HPCC) module. In yet another variant, the control module is adapted to communicate with and control the one or more powered devices via wireless apparatus. In one facet, the wireless apparatus utilizes at least one of: radio frequency (RF) or infrared (IR) energy.

In yet another variant, the at least one sensor apparatus comprises a power sensor, the power sensor adapted to measure watt-hours used and watt-hours accumulated for at least one powered device. In another variant, at least one sensor apparatus is adapted to measure at least one of power, current, voltage, power factor, temperature, frequency, or at least one harmonic. In yet another variant, the at least one sensor comprises an external sensor adapted to measure at least one of: current from a current transformer, voltage, or temperature.

In still another variant, the plurality of mechanical components effecting a circuit breaking function comprise at least one of: a magnetically latching activator, a solid state switch, a relay, a solenoid, or a mechanical latch.

In yet another variant, the act of evaluating the at least one powered device comprises comparing the data regarding activity occurring on the at least one powered device to reference data. In one facet, the reference data comprises at least one of: data recorded from normal operation of the at least one powered device, data downloaded from a data source via secure communication therewith or data stored on the circuit breaker apparatus by a manufacturer thereof. In another facet, the act of controlling the at least one powered device based at least in part on the evaluation comprises causing the at least one powered device to shut down if the data regarding the at least one powered device and the reference data differ more than a predetermined threshold. The act of shutting down the at least one powered device comprises triggering the plurality of mechanical components effecting the circuit breaking function. In yet another facet, the act of controlling the at least one powered device based at least in part on the evaluation comprises causing the at least one powered device to shut down if the data regarding the at least one powered device and the reference data differ more than a predetermined threshold. The act of shutting down the at least one powered device comprises triggering the plurality of mechanical components effecting the circuit breaking function. In another facet, the act of controlling the at least one powered device based at least in part on the evaluation comprises communicating to the at least one powered device one or more commands.

In another variant, the apparatus is further adapted to record said evaluation for delivery to a user device via communication therewith.

In a final variant, the circuit breaker apparatus further comprises at least one manual actuation apparatus, the actuation apparatus enabling the circuit breaker apparatus to perform various functions including at least one of: resetting the circuit breaker apparatus, beginning a diagnosis mode, beginning a self-test mode, or calibrating the apparatus based on presently sensed data regarding the powered devices, and at least one LED indicator, the indicator indicative of a status or mode of the circuit breaker apparatus.

In another embodiment, the circuit breaker apparatus comprises a power supply, a control module, the control module adapted to comprise at least a mechanism for determining time, and a plurality of mechanical components providing a circuit breaking function of the circuit breaker. According to this embodiment, the control module is in data communication with at least one user device, and is adapted to control operation of at least one of a plurality of powered devices associated with the circuit breaker based at least in part on the at least one mechanism for determining time.

In one variant, the power supply comprises at least one of: (i) a transistor, zener diode and an opto-isolator with shunt resistor that provides both a 5V converter regulation as well as a 3.3V output, or (ii) a power supply without a tapped inductor, the power supply comprising a series capacitor with a Zener diode and rectifier adapted to drop input AC voltage to approximately 30V and a 30V low voltage converter to power at a voltage less than 30V.

In another variant, the control module is adapted to communicate with and control the one or more powered devices via power conductors associated with the devices. In yet another variant, the control module is adapted to communicate with and control the one or more powered devices via wireless apparatus.

In another variant, the mechanism for determining time comprises a real-time clock, or a periodically updated software clock.

In another variant, the plurality of mechanical components effecting a circuit breaking function comprise at least one of: a magnetically latching activator, a solid state switch, a relay, and a mechanical latch.

In yet another variant, the circuit breaker apparatus comprises an enclosed plug-in module. The plug in module may comprise a 120V or 240V home outlet plug in module. In yet another variant, the circuit breaker apparatus comprises a wired-in module.

In another variant, the act of controlling operation of the at least one powered device based at least in part on the at least one mechanism for determining time comprises: (i) preventing the at least one powered device from receiving power when the mechanism for measuring time indicates a time within a first time range, or (ii) permitting the at least one powered device to receive power when the mechanism for measuring time indicates a time within a second time range. In one facet, the first and second time ranges comprise one of: pre-set time ranges or user-entered time ranges, the user-entered time ranges entered by at least one user input at the user device via communication therewith. In another facet, the at least one powered device is prevented from receiving power by the control module interrupting a circuit associated with the circuit breaker via manipulation of at least one of the plurality of mechanical components effecting the circuit breaking function, and the at least one powered device is permitted to receive power by the control module via manipulating at least one of the plurality of mechanical components providing the circuit breaking function.

In another embodiment, the circuit breaker apparatus is in data communication with at least one user device and has a plurality of powered devices associated therewith and the apparatus comprises a power supply, a plurality of mechanical components effecting a circuit breaking function of the circuit breaker, at least one sensor apparatus, the at least one sensor apparatus adapted to transmit data regarding sensed activity occurring on at least one of the plurality of powered devices, and a control module adapted to receive the transmitted data, the control module comprising at least one computer program configured to: receive the data, measure time, perform one or more mathematical calculations based at least in part on the received data and the measured time, send information regarding the calculations to the at least one user device, and control the operation of the at least one powered device based at least in part on the calculations.

In one variant, the calculations comprise calculations enabling the apparatus to determine at least one of: power consumption, power accumulation, costs associated with amount of power consumed, and estimated power usage based on statistics related to previous use. In one facet, the calculation for determining costs associated with amount of power consumed utilizes information regarding at least one of: graded levels of costs associated with power consumption, graded levels of costs associated with power uses, and division of power usage among multiple dwelling units having at least one powered device associated with the circuit breaker apparatus.

In another variant, the computer program is further adapted to: diagnose the at least one of the one or more powered devices, and control the operation of the at least one powered device operating on a circuit serviced by the breaker, the act of controlling based at least in part on the diagnosis.

In yet another variant, the computer program is further adapted to manage functioning of at least one of the plurality of powered devices based at least in part on the measured time and first and second stored time ranges by: preventing the at least one powered device from receiving power when the measured time is within the first time range by causing an the circuit breaker to open, and permitting the at least one powered device to receive power when the measured time is within the second time range by causing the circuit breaker to close.

In a twelfth aspect of the invention, a method of utilizing a circuit breaker apparatus is given. In one embodiment, the circuit breaker apparatus is utilized to evaluate one of a plurality of powered devices associated with the apparatus and the method comprises receiving data from at least one sensor apparatus adapted to sense activity occurring on at least one of a plurality powered devices operating on a circuit serviced by a circuit breaker, comparing the data to standard data stored on a storage apparatus, and communicating an action to the at least one powered device, based at least in part on the act of comparing.

In one variant, the at least one sensor apparatus is adapted to measure at least one of power, current, voltage, power factor, temperature, frequency, or harmonics.

In another variant, the standard data comprises at least one of: data recorded from normal operation of the at least one powered device, data downloaded from a data source via secure communication therewith, or data stored on the circuit breaker apparatus by a manufacturer thereof.

In another variant, the act of comparing comprises comparing the received data and the reference data, and determining, based at least in part on the comparison, whether a predetermined criterion has been met. In one facet, the act of communicating an action to the at least one powered device, based at least in part on the act of comparing comprises causing a shut down of the at least one powered device if the predetermined criterion is met. In another facet, the act of communicating an action to the at least one powered device, based at least in part on the act of comparing comprises: communicating at least one of the received data and the reference data to a user device, receiving at the user device at least one user command, and communicating the at least one user command to the at least one powered device.

In yet another variant, the act of comparing comprises diagnosing at least one operational problem with the at least one powered device by using the received data to categorize a state of the at least one powered device according to at least one of a plurality of stored categories, and the act of communicating an action to the at least one powered device based at least in part on the act of comparing comprises communicating the categorization to the at least one powered device.

In another embodiment, the circuit breaker apparatus is utilized to schedule the operation of a plurality of powered devices associated with a circuit breaker, and the method comprises storing information comprising at least a first and second time range, determining a current time, and managing functioning of at least one of the plurality of powered devices based at least in part on the stored time ranges and the current time.

In one variant, the information comprising one or more time ranges comprises at least one of pre-set time ranges or user-entered time ranges, the user-entered time ranges entered by at least one user input a user device in secure data communication with the circuit breaker.

In another variant, the at least one mechanism for determining time comprises at least one of a real-time clock, or a periodically updated software clock.

In yet another variant, the act of managing functioning of the at least one powered device based at least in part on the stored time ranges and the current time comprises: preventing the at least one powered device from receiving power when the current time is within the first time range, and permitting the at least one powered device to receive power when the current time is within the second time range. In one facet, the act of preventing the at least one powered device from receiving power comprises causing interruption of a circuit via manipulation of one or more mechanical components effecting circuit breaking function resident within the circuit breaker. The act of permitting the at least one powered device to receive power comprises causing completion of a circuit via manipulation of at least one mechanical component effecting circuit breaking function resident within the circuit breaker.

In a thirteenth aspect of the invention, system for evaluating and scheduling operation of one of a plurality of powered devices associated with the circuit breaker apparatus is disclosed. In one embodiment, the system comprises a circuit breaker apparatus comprising at least a control module, a plurality of mechanical components effecting circuit breaking function, and at least one sensor apparatus, a user interface, and a plurality of powered devices associated with the circuit breaker apparatus. The circuit breaker apparatus is adapted to communicate with and control the plurality of powered devices.

In one variant, the control module is adapted to evaluate at least one of the plurality of powered devices by: receiving data regarding activity occurring on the at least one powered device sensed at the sensor apparatus, categorizing the data according to at least one of a plurality of categories, communicating, via a secure connection, the categorization to the user interface, receiving an input from the user interface indicating an action to be taken in response to the categorization, and causing the action to be carried out on the at least one powered device. In one facet, the communication, via a secure connection, comprises communication subsequent to password confirmation at a user interface. In another facet, the password confirmation comprises a mechanism disabling the system when an incorrect password is given more than a prescribed number of times.

In another variant, the plurality of categories comprise at least one of: a category calculated from normal operation of the at least one powered device, a category downloaded from a data source via secure communication therewith, or a category stored on the circuit breaker apparatus by a manufacturer thereof.

In yet another variant, the control module is adapted to schedule the operation of at least one of the plurality of powered devices by: receive information regarding at least first and second time ranges from the user interface via a secure connection thereto, determine the current time, and manage functioning of the at least one powered device based at least in part on the stored time ranges and the current time.

These and other aspects of the invention will be readily appreciated by those of ordinary skill provided the present disclosure.

BRIEF DESCRIPTION OF THE DRAWINGS

The features, objectives, and advantages of the invention will become more apparent from the detailed description set forth below when taken in conjunction with the drawings, wherein:

FIG. 7b is a block diagram illustrating an exemplary method of converting an existing circuit breaker to an ICB.

DETAILED DESCRIPTION OF THE PREFERRED EMBODIMENT

Figure 1:
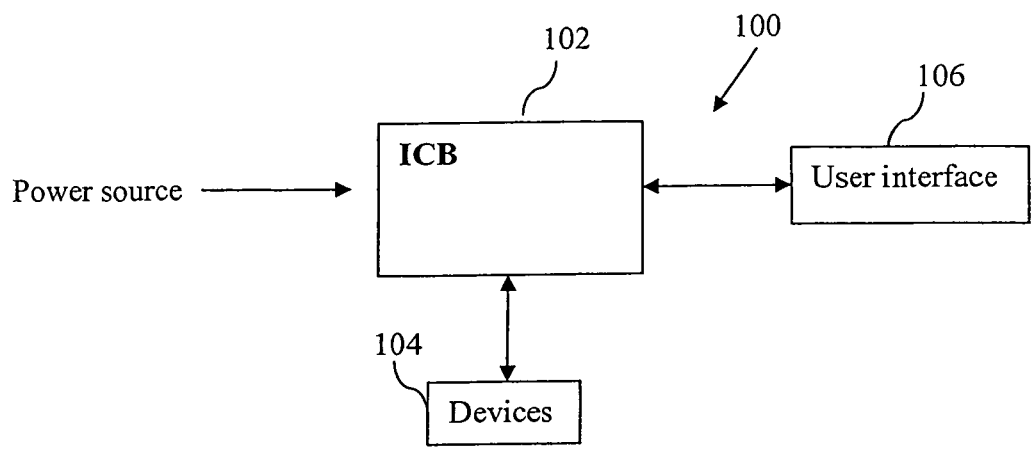
FIG. 1 is a block diagram of an exemplary system utilizing an intelligent circuit breaker (ICB)

Reference is now made to the drawings wherein like numerals refer to like parts throughout.

As used herein, the term "signal conditioning" or "conditioning" shall be understood to include, but not be limited to, signal voltage transformation, filtering and noise mitigation or elimination, current limiting, sampling, signal processing, and time delay.

As used herein, the term "integrated circuit" shall include any type of integrated device of any function, whether single or multiple die, or small or large scale of integration, and irrespective of process or base materials (including, without limitation Si, SiGe, CMOS and GAs) including without limitation applications specific integrated circuits (ASICs), field programmable gate arrays (FPGAs), digital processors (e.g., DSPs, CISC microprocessors, or RISC processors), so-called "system-on-a-chip" (SoC) devices, memory (e.g., DRAM, SRAM, flash memory, ROM), mixed-signal devices, and analog ICs.

The term "processor" is meant to include any integrated circuit or other electronic device (or collection of devices)

capable of performing an operation on at least one instruction including, without limitation, reduced instruction set core (RISC) processors, CISC microprocessors, microcontroller units (MCUs), CISC-based central processing units (CPUs), and digital signal processors (DSPs). The hardware of such devices may be integrated onto a single substrate (e.g., silicon "die"), or distributed among two or more substrates. Furthermore, various functional aspects of the processor may be implemented solely as software or firmware associated with the processor.

As used herein, the term "application" refers generally to a unit of executable software that implements theme-based functionality The themes of applications vary broadly across any number of disciplines and functions (such as e-commerce transactions, brokerage transactions, mortgage interest calculation, home entertainment, calculator etc.), and one application may have more than one theme. The unit of executable software generally runs in a predetermined environment; for example, the unit could comprise a downloadable Java Xlet™ that runs within the Java™ environment.

As used herein, the term "computer program" is meant to include any sequence or human or machine cognizable steps which perform a function. Such program may be rendered in virtually any programming language or environment including, for example, C/C++, Fortran, COBOL, PASCAL, assembly language, markup languages (e.g., HTML, SGML, XML, VoXML), and the like, as well as object-oriented environments such as the Common Object Request Broker Architecture (CORBA), Java™ (including J2ME, Java Beans, etc.) and the like.

As used herein, the terms "network" and "bearer network" refer generally to any type of telecommunications or data network including, without limitation, data networks (including MANs, WANs, LANs, WLANs, internets, and intranets), hybrid fiber coax (HFC) networks, satellite networks, and telco networks. Such networks or portions thereof may utilize any one or more different topologies (e.g., ring, bus, star, loop, etc.), transmission media (e.g., wired/RF cable, RF wireless, millimeter wave, optical, etc.) and/or communications or networking protocols (e.g., SONET, DOCSIS, IEEE Std. 802.3, ATM, X.25, Frame Relay, 3GPP, 3GPP2, WAP, SIP, UDP, FTP, RTP/RTCP, H.323, etc.).

As used herein, the term "wireless" includes, but is not limited to, IS-95, CDMA2000, Wideband CDMA (WCDMA), IrDA interface, IEEE Std. 802.11(a) or (g), Wireless Application Protocol (WAP), GPRS, GSM, TDMA (e.g., IS-54 or 136), UMTS, third-generation or "3G" systems such as 3GPP and 3GPP2, ultrawideband (UWB) systems such as TM-UWB or 802.15, Bluetooth, ZigBee, Z-Wave, WiMAX, satellite systems, or any other of myriad data communication systems and protocols well known to those of skill in the communications arts.

As used herein, the term "digital subscriber line" (or "DSL") shall mean any form of DSL configuration or service, whether symmetric or otherwise, including without limitation so-called "G.lite" ADSL (e.g., compliant with ITU G.992.2), RADSL: (rate adaptive DSL), VDSL (very high bit rate DSL), SDSL (symmetric DSL), SHDSL or super-high bit-rate DSL, also known as G.shds1 (e.g., compliant with ITU Recommendation G.991.2, approved by the ITU-T February 2001), HDSL: (high data rate DSL), HDSL2: (2nd generation HDSL), and IDSL (integrated services digital network DSL), UDSL, as well as In-Premises Phoneline Networks (e.g., HPN).

As used herein, the terms "client device" and "end user device" include, but are not limited to, personal computers (PCs) and minicomputers, whether desktop, laptop, or otherwise, set-top boxes, personal digital assistants (PDAs) such as the Apple Newton®, "Palm®" family of devices, handheld computers such as the Hitachi "VisionPlate", personal communicators such as the Motorola Accompli devices, J2ME equipped devices, cellular telephones, or literally any other device capable of interchanging data with a network.

Additionally, the terms "site", "premises" and "structure" as used herein shall include any location (or group of locations) having one or more functions capable of using one or more aspects of the present invention including, without limitation, residential houses, apartments, trailers, watercraft (e.g., "houseboats"), motor homes, offices, and businesses.

As used herein, the term "extension device" is meant to include any type of telecommunications device compatible with use on existing telecommunications lines, including without limitation conventional telephones, answering machines, facsimile machines, wireless or satellite receivers, and multi-line phones.

As used herein, the term "display" means any type of device adapted to display information, including without limitation LCDs, TFTs, plasma displays, LEDs, CRTs, FEDs, OLED and fluorescent devices.

As used herein, the term "controller" generally refers to an apparatus or algorithm providing one or multiple control functions to itself or another device. Examples of controllers include servers, schedulers, microcontrollers, PID controllers, PIC microcontrollers and so forth.

As used herein, the term "powerline" refers to any technology which is used to transfer data or signals over a power distribution system, including without limitation UPB, HomePlug, HomePlug a/v, and X-10 technologies.

As used herein, the term "UPB" or Universal Powerline Bus refers generally to technologies which impose digital or analog signals or pulses onto AC waveforms or DC power delivery systems, such as for example the well known UPB industry standard approach as set forth in "Universal Powerline Bus: The UPB System Description", Version 1.1 dated Sep. 19, 2003, incorporated herein by reference in its entirety.

Also, as used herein, the term "homeplug" as used herein is meant specifically to include devices and systems compliant with the HomePlug™ Powerline Alliance Specification for powerline-based home networks (including the more recent HomePlug A/V), and generally to include all other comparable devices adapted for powerline networking.

Lastly, it is noted that in the present context, the term "control" may be as simple as control of signals and/or power applied to a device (i.e. turning AC or DC power to the device on or off), or as complex as processor/microcontroller-based, algorithmically controlled, multivariate operation; such as that described in co-owned, co-pending U.S. patent application Ser. No. 11/218,899, filed Sep. 2, 2005 entitled "UNIVERSAL CONTROL APPARATUS AND METHODS", which is incorporated herein by reference in its entirety. "Control" may also include the prevention of one or more occurrences. Hence, the term "control" shall be construed broadly in the present context.

Overview

In one salient aspect of the invention, an improved "intelligent" circuit breaker apparatus is disclosed. In one embodiment, the breaker comprises a power supply, a control module adapted to communicate with one or more powered devices operating on a circuit serviced by the breaker, at least one sensor, and a plurality of mechanical components effecting a circuit breaking function. The control module of the circuit breaker apparatus is adapted to communicate with the powered devices in order to evaluate and control them. Evaluation of powered devices comprises sensing power data (such as power consumption, current, voltage, etc.) and comparing it to reference or standard data. The circuit breaker apparatus controls the powered device, based on the comparison. The circuit breaker apparatus may indicate to a user the status of the device, may indicate the status to the device itself, or may cause power to cease flowing to the device.

Control of the powered devices may alternatively be based on e.g., timing. For example, the circuit breaker may be adapted to enable a user, or other authorized person, to set certain time periods within which a particular device may or may not be used. Thus, the power company could prescribe that dryers cannot be used between 12 pm and 5 pm; accordingly, the circuit breaker would stop the dryer from receiving power during that time period.

The circuit breaker apparatus may also perform one or more mathematical calculations including power consumption, power accumulation, costs associated with power consumed, and estimated power use for future periods given previous periods of use.

Communication between the circuit breaker apparatus and the powered devices may occur via power conductors associated with the devices, such as utilized by the HomePlug Command and Control module. Alternatively, the devices may communicate wirelessly, or via other means.

Intelligent Circuit Breaker (ICB) System

It will be recognized that while the terms "home" and "consumer" may be used herein in association with one or more aspects and exemplary embodiments of the invention, the invention is in no way limited to 'such applications. The various aspects of the present invention may be applied with equal success in, inter alia, small or large business (e.g., so-called "enterprise" systems), industrial, and even military applications if desired. It is further noted that one or more of the described components may be used in conjunction with one another, i.e. an exemplary system may include one device or many, likewise one ICB or more may be utilized. Furthermore, while certain embodiments are described in terms of an exemplary UPB or HomePlug protocols, the use of a particular protocol within a particular device is completely flexible, and other such protocols or technologies can be substituted. Accordingly, the following discussion is merely exemplary of the broader concepts.

It is also appreciated that traditional circuit breakers are often employed on a panel having several individual circuit breakers disposed thereon; and while the present invention is primarily described in terms of a single circuit breaker, the ICB of the present invention would advantageously be employed in a manner consistent with that of traditional circuit breaker systems, i.e. more than one ICB disposed on a panel and thus covering all or a plurality of the devices in a home or other premises. It is further noted that the present invention may also advantageously comprise multiple ICB mechanically and electrically connected in split phase and/or three-phase distribution systems and/or other configurations to achieve alternative distribution goals.

Referring now to FIG. 1, an exemplary system 100 utilizing a substantially automated intelligent circuit breaker 102 is described in detail. As illustrated, the system 100 comprises at least one intelligent circuit breaker (ICB) 102, which will be discussed in further detail below. The ICB 102 is in communication with a plurality of power utilizing devices 104 and a user interface 106. The ICB 102 may be a single 15A, 20A, 30A, 40A, or 50A circuit; or alternatively may comprise a 240V split phase, or three-phase circuit (thus necessitating several ICB 102) as discussed below.

The power utilizing devices 104 include any electrical devices operating in or adjacent to a consumer's premises. The power utilizing devices 104 may therefore include, inter alia, appliances (e.g. washer, dryer, dishwasher, etc.), computers, televisions, air conditioning units, water heaters, lighting devices, pool equipment, and telephone devices. All of the electrical items that are powered can generally be monitored and controlled to some extent, to include literally any type of electronic or electro-mechanical devices capable of receiving control inputs. Communication between the power utilizing devices 104 and ICB 102 of the present invention may be accomplished via the shared wired electrical connection, or alternatively may be accomplished via a wireless technology, such as by utilizing Bluetooth technology, WiMAX, ZigBee, etc. It will be appreciated however, that in many instances the wired approaches have the advantages of ultra-low cost and simplicity of installation (and operation) as well as reliability. It is however recognized that wireless systems and interfaces are becoming much more ubiquitous. For example, in one variant of the present invention, one or more devices 104 configured with short-range wireless interfaces such as e.g., those compliant with the Bluetooth or IrDA specifications, thereby obviating a direct wiring run from the device 104. This approach adds significant flexibility, yet increases the cost of the devices 104 (and also the controlled components). The present invention also contemplates the use of multiple air interfaces (e.g., Bluetooth, WiFi, etc.) in a common platform in order to provide heterogeneous wireless capabilities, such as those capable of different data rates or communication ranges.

The user interface 106 may, in one embodiment, comprise a physical display (not shown) with which a user may interact disposed directly on the ICB 102. Such display might comprise e.g., an LCD touch screen of the type well known in the art, or simply a passive display device (e.g., LCD or LED). According to this embodiment, the ICB 102 would be adapted to include a more complex processing system, increased storage, and display and input elements. In another embodiment, the user interface 106 is physically located remote to the ICB 102 and ICB system 100. The user interface 106 may, for example, be a computer program adapted to be run on a user's personal computer, laptop, or other computerized device such as a smartphone. Alternatively, the user interface 106 may comprise a web-based interface accessible by any internet-enabled device and able to download/upload data regarding power, power factor, current, frequency, rates, and tiered rates, etc.

In yet another example, the user interface 106 may exist purely at the manufacturer or distributor or service provider (e.g., electric company or its proxy) with no user interface per se accessible by the consumer of the ICB 102.

In yet another example, the user interface 106 may exist at an external monitoring service provider, such as a security monitoring company. The external monitoring service provider can then provide data as well as other information to the consumer via alternative arrangements.

Intelligent Circuit Breaker (ICB)

As discussed above, a key component of the ICB system 100 is the ICB 102 itself. Generally, the exemplary embodiment of the ICB 102 comprises a plurality of components, including inter alia, a low-frequency AC power supply network (e.g., HomePlug or comparable powerline system) system, a power sensor, and various circuit breaker mechanical components. Each of these components as well as other embodiment-specific components will be discussed in detail below. As will be described in greater detail below, these components interact with one other to varying degrees in order to effectuate the desired monitoring and control of the various devices 104 within the system.

Relay-Activated Embodiment

Figure 2:
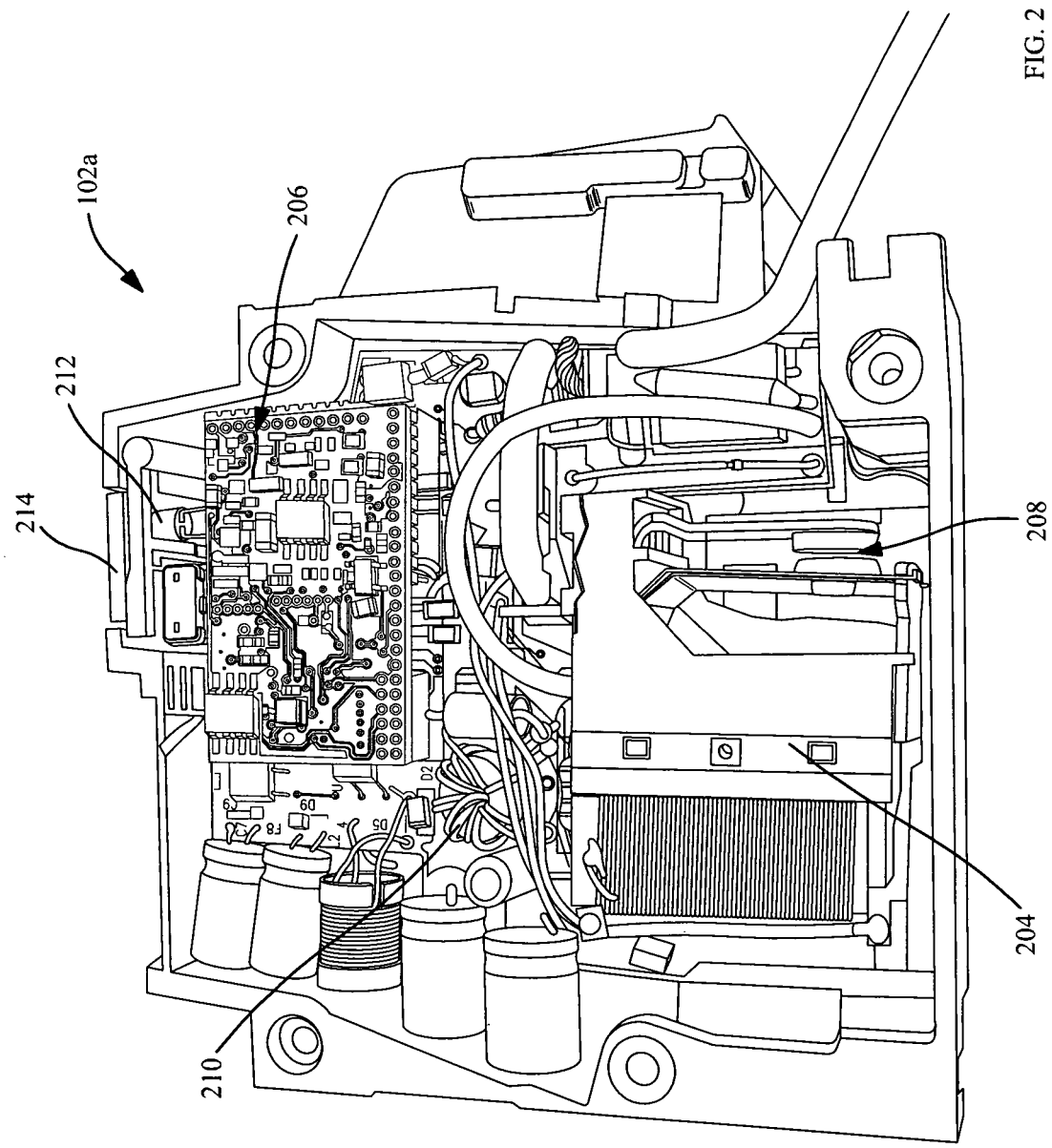
FIG. 2 is a photograph of an actual exemplary embodiment of the ICB of the present invention utilizing a latching relay.

Referring now to FIG. 2, a photograph of an actual exemplary ICB 102a is depicted. In the illustrated embodiment, the ICB 102a is relay-activated. Ideally, the latching relay of the relay-activated intelligent circuit board 102a comprises a magnetic latch however; mechanical latching (such as lever, screw, motor, magnet, spring latch, etc.) and single state stable relays and/or solenoid actuators may also be utilized consistent with the present invention.

Figure 2A:
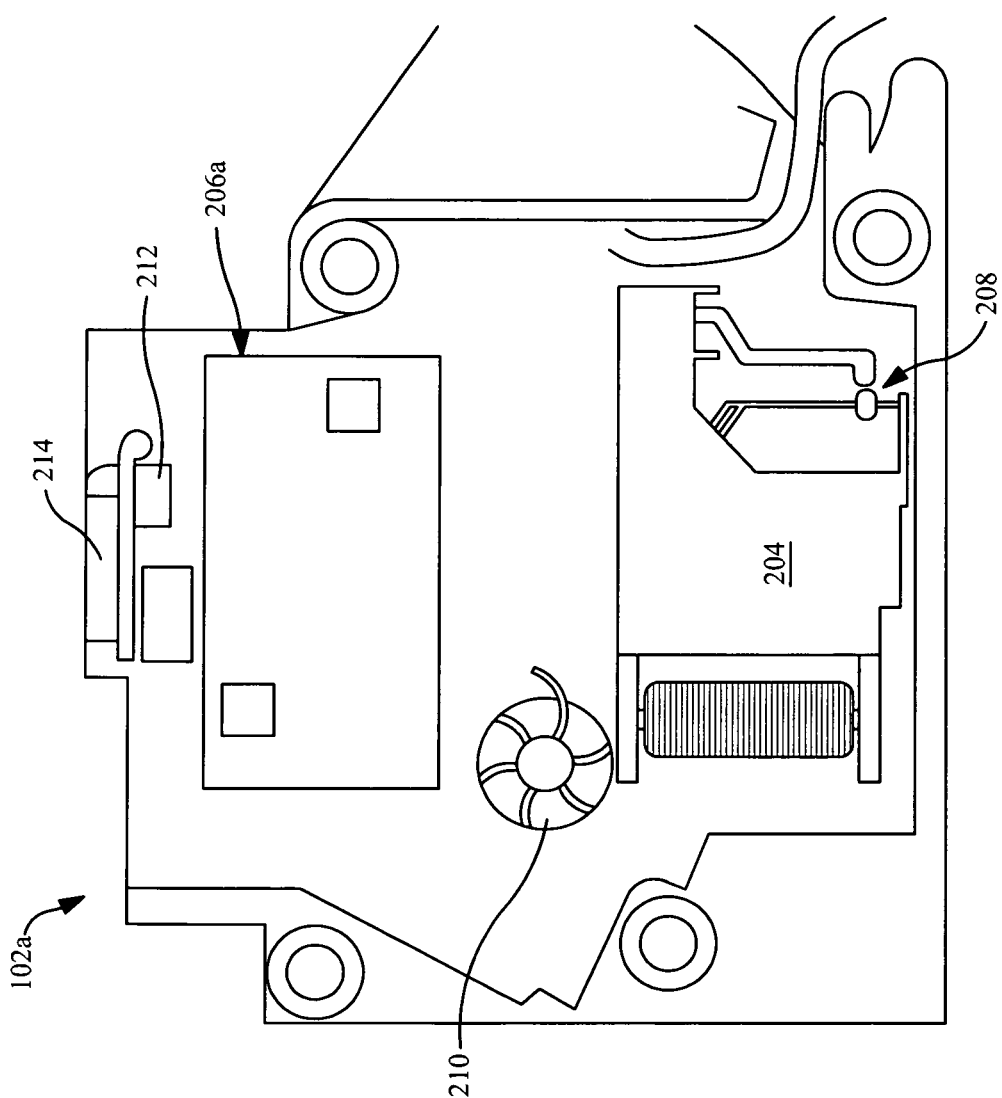
FIG. 2a is a schematic diagram of an exemplary embodiment of the ICB of the present invention utilizing a latching relay.

FIG. 2a is a block diagram illustrating, in more detail, the various components of an exemplary ICB 102a utilizing a latching relay 204.

The illustrated embodiment of the relay-activated ICB 102a generally comprises a toroidal inductor 210 of the type well known in the electronic arts. However, it is appreciated that in an alternative embodiment (not shown), the toroid 210 may be eliminated since isolation is not required for the design. Rather, the minimization of noise coupling in the absence of the toroid 210 can be accomplished via a careful layout, and/or other techniques known to the skilled artisan.

The relay-activated ICB 102a also generally comprises a relay 204 associated with a printed circuit board assembly 206a. The relay 204 of the illustrated embodiment advantageously comprises relay contacts 208 which complete the circuit associated with the ICB 102a when in the "closed" position and interrupt the circuit when switched to an "open" position. In the illustrated embodiment, a magnetically latching relay 204 is depicted; however, as discussed above, it will be appreciated that other latch mechanisms may be incorporated consistent with the present invention. The printed circuit board assembly 206a, inter alia, comprises a controller 224 which will be discussed in greater detail below.

The relay-activated ICB 102a also comprises an LED light 212 and a push button switch 214. The push button switch 214 allows a user to manually control the function of the ICB 102a. Specifically, the switch 214 is used to put the controller 224 into program mode. During program mode, the appropriate address and security code (e.g., that of the ICB node 102a or another node in communication therewith) can be securely loaded into the controller 224. It is appreciated that in one embodiment, the system may be designed to "lock" a user out if an incorrect password, security code or ID is supplied more than a certain number of times; thereby making the system tamper proof. According to this model, it may be appreciated that the manufacturer may install a seal or other device in order to disable certain functions of the system to an unauthorized user. The switch 214 may also be used to reset an ID or pass code, change modes (e.g., between on/off, program mode, self-test mode, etc.) The LED light 212 is adapted to indicate to a viewer the status of the relay 204 on the ICB 102a. Thus, the LED 212 may comprise a bi-color light, with flashing, etc. capabilities so as to confirm on/off, program mode, self-test mode, and various other indictors during programming or operation. The LED 212 may also indicate which version of various programs is selected and/or indicate an error via a watchdog or diagnostic (or last state) program. Other components of the relay-activated ICB 102a well known in the art are illustrated as well.

Figure 2B:
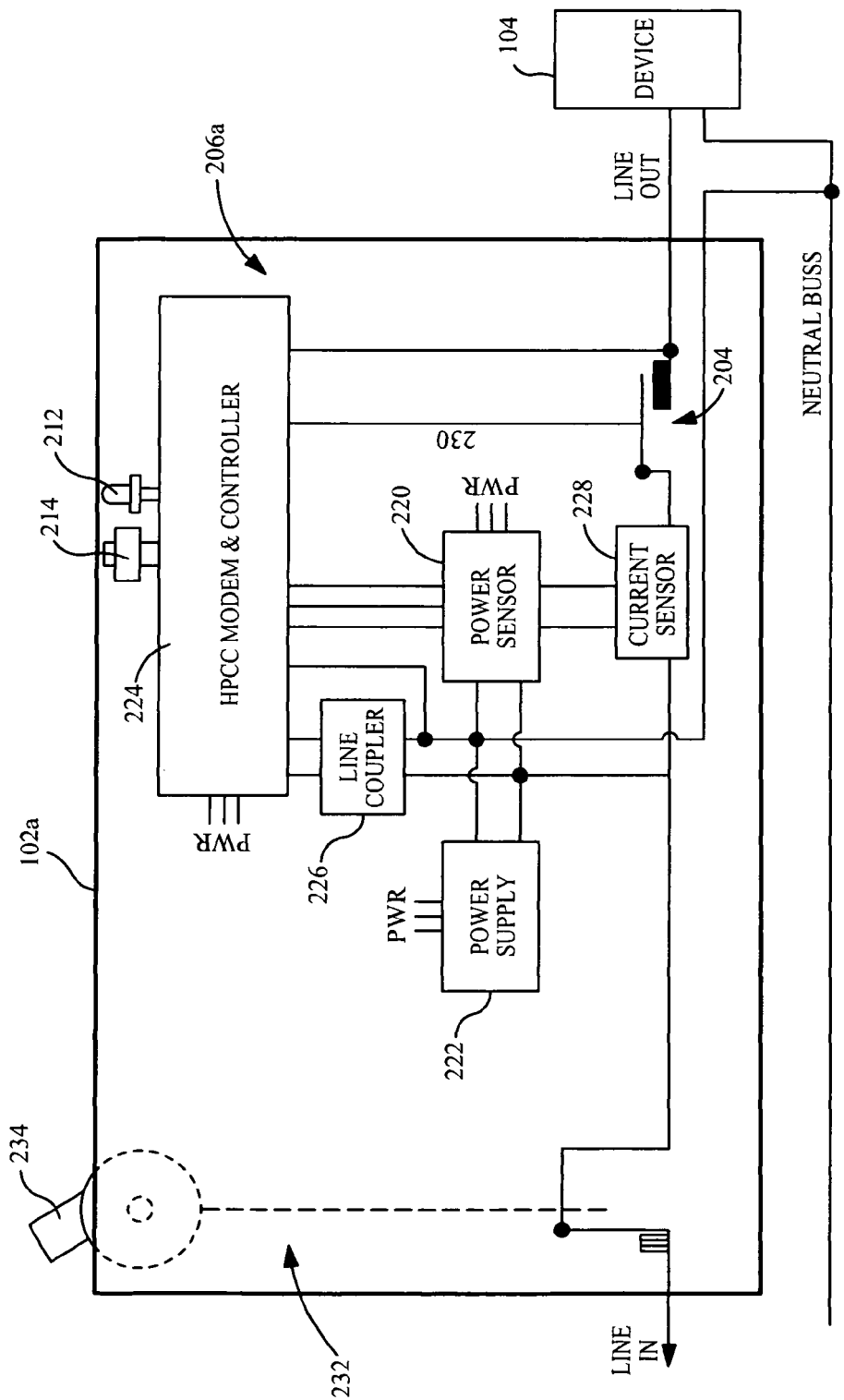
FIG. 2b is a block diagram of the exemplary PCB assembly for use with an exemplary ICB utilizing a latching relay according to the present invention.

FIG. 2b illustrates the circuitry present on the printed circuit board assembly 206a of the relay-activated ICB 102a embodiment discussed above. As illustrated, the PCB circuitry comprises an off-line power supply 222 disposed thereon. The off-line power supply 222 provides power for the controller 224 and the power sensor 220.

The assembly 206a further comprises a low-frequency AC power supply network (e.g., HomePlug or comparable powerline system or other system utilizing radio frequency (RF) waves, wireless communication methods, or infrared (IR) or other light based communication for communication with devices 104) system which is depicted by its controller sub-board 224. The controller 224 has a transmit/receive coupling to the line and neutral using T1, a toroid transformer. However, as noted above, other powerline communications approaches may also be used to control the breaker.

A power sensor sub-board 220 which is adapted to monitor (i.e. sense) power usage is also disposed in the ICB 102a. The power sensor 220 in this embodiment is an integrated circuit (IC), ADE7753, designed for power measuring. The power sensed is communicated by a "SPI" port 402 to the controller 224. The controller 224 can collect and manage the watt-hours used (both positive and negative watt-hours) and also provide voltage, current, frequency, temperature and power factor data. R43 is the shunt to measure the load current; however, a current sensor transformer or a Rogowski coil may be advantageously utilized as well. In one embodiment, the power sensor 220 comprises an external sensor input adapted to measure current from the current transformer, voltage, frequency or pulse, temperature (via a thermocoupler and RTD thermistor), discrete (dry-contact or TTL), and/or an analog or digital set-point. The contact or TTL input may be used to externally enable or disable certain functions, such as the timer, diagnostic data recording and power measurement.

The power sensor 220 is also, in one embodiment, adapted to measure one or more output parameters to estimate whether the devices attached to that ICB 102a are switched on or off. The estimate may be based in part on power usage (e.g., according to P=IV), in that certain states correspond to certain current usage. Thus, in an example where three devices 104 are served on one outlet, different power usage states would correspond to there being no devices 104 "on", only one device 104 on, two devices 104 on, and all three devices 104 on. As used in this context, the term "on" refers to a state where the power consumption is at least intermittently significant, as contrasted with insignificant but substantially continuous current draw (such as the clock on a powered-down oven). The ICB 102a, via its memory, may be adapted to access the threshold or nominal power usages or ratings for each state, and accordingly make a determination or estimate as to the operational state of each device. The ICB 102a may know the states by preprogramming the ICB 102a for the devices associated with each circuit (e.g., a 1000 W hairdryer, 60 W incandescent lamp, and 1200 W steam iron all served by the same circuit); or, alternatively the ICB 102a may have preprogrammed threshold or rating values. In yet another embodiment, the ICB 102a would be adapted to communicate with properly equipped devices 104 by sending/receiving data over the power conductors according to a prescribed communication protocol, thereby directly determining the rating(s), duty cycle, etc. of each device, and even its status (e.g., powered on, off, clock on, standby, etc.). Accordingly, "smart" appliances would be adapted to transmit signals to the ICB 102a, or make such data accessible to the ICB upon inquiry.

The PCB assembly 206a may also advantageously comprise a line coupler 226 and/or current sensor 228 of the type well known in the electrical arts.

The PCB assembly 206a of the relay-activated ICB 102a also depicts the above described association of the LED light 212 and push button switch 214 with the PCB 206a. As is illustrated, both the LED light 212 and the switch 214 are powered by the power supply 222. Also as discussed above, the switch 214 permits a user or other activation device to physically cause the completion or interruption of the circuit.

As is well known in the electronic arts, the relay 204 is adapted to act as an electric switch that opens and closes under control of a relay controlling circuit 230 which is disposed on the printed circuit board 206a of the ICB 102a. The PCB assembly 206a depicts the relay controlling circuit 230 and its association to the relay 204 as discussed. The relay 204 may control whether or not the circuit is complete via the controlling circuit 230 in a separate (and/or remote) mechanism than the user-activated push button switch 214 (which may be primarily utilized as a "test" button).

The relay 204 is driven via TRIACs, Q1/Q2, through diodes since the magnetically latching requires a DC pulse. It is appreciated; however, that other relays (not shown) may be utilized consistent with the present invention, such other relays may require AC without diodes. The R9 senses for output to verify that the relay 204 has switched, and R11 indicates the 60 cycle zero crossings to determine proper switching time.

Also depicted in FIG. 2b is the standard circuit breaker 232 having toggle switch 234. It is appreciated that the ICB 102a of the present embodiment is adapted to work in conjunction with the existing circuit breaker 232 such that the controller 224 may override the standard circuit breaker 232 and cause a fault condition and/or may restore the breaker from fault condition.

Actuator-Activated Embodiment

Figure 3:
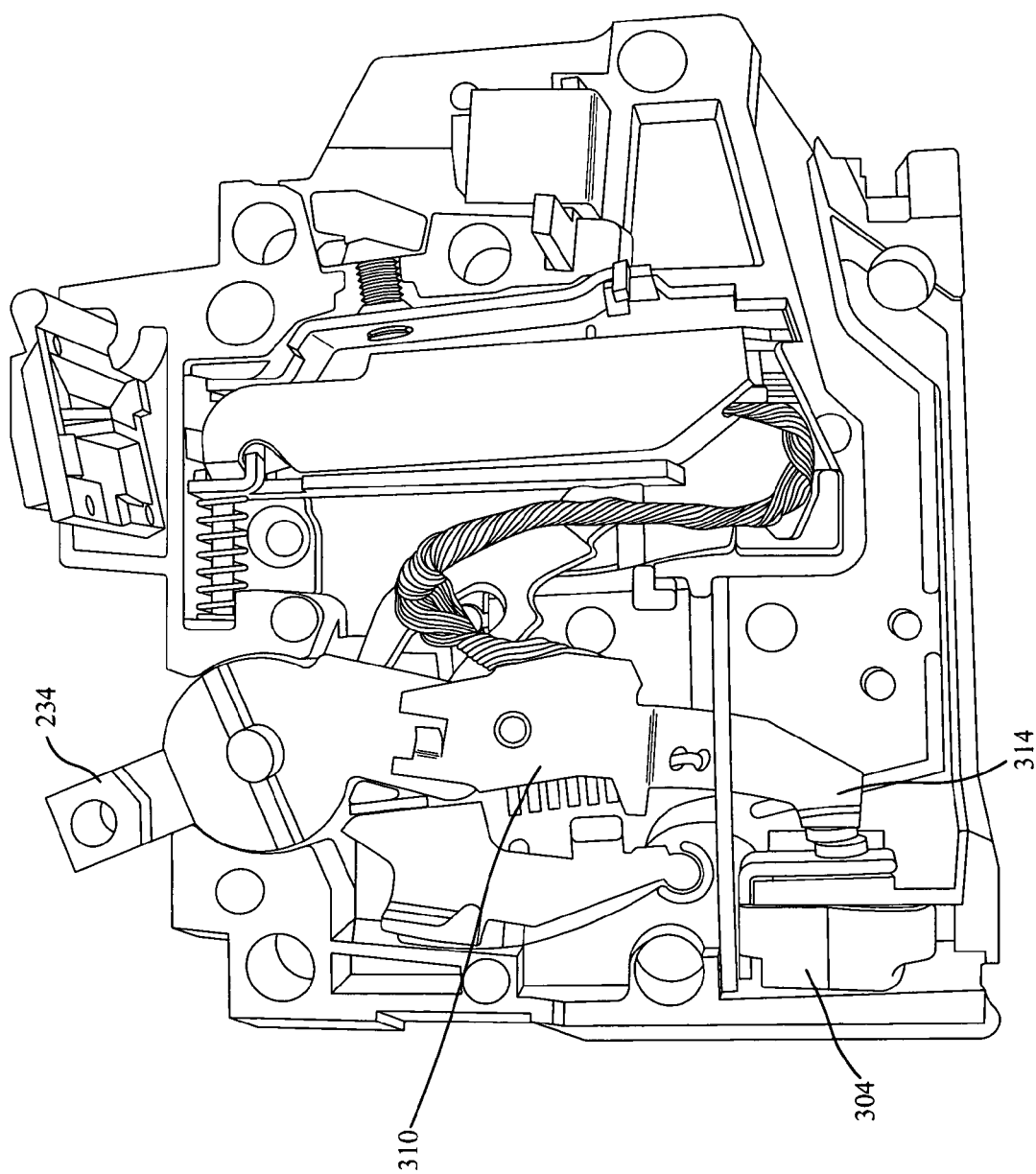
FIG. 3 is a photograph of an actual exemplary ICB of the present invention utilizing a latching actuator.

Referring now to FIG. 3, a photograph of a second actual exemplary ICB 102b is depicted. In the illustrated embodiment, the ICB 102b is actuator-activated to mechanically push open the circuit breaker contact to turn off the output. The illustrated embodiment depicts a magnetically latching activator, however, an electronic solenoid with magnetic latch (or mechanical latch such as a lever, screw, motor, magnet, spring latch, etc.) and single side stable latching mechanisms may also be utilized consistent with the present invention.

Figure 3A:
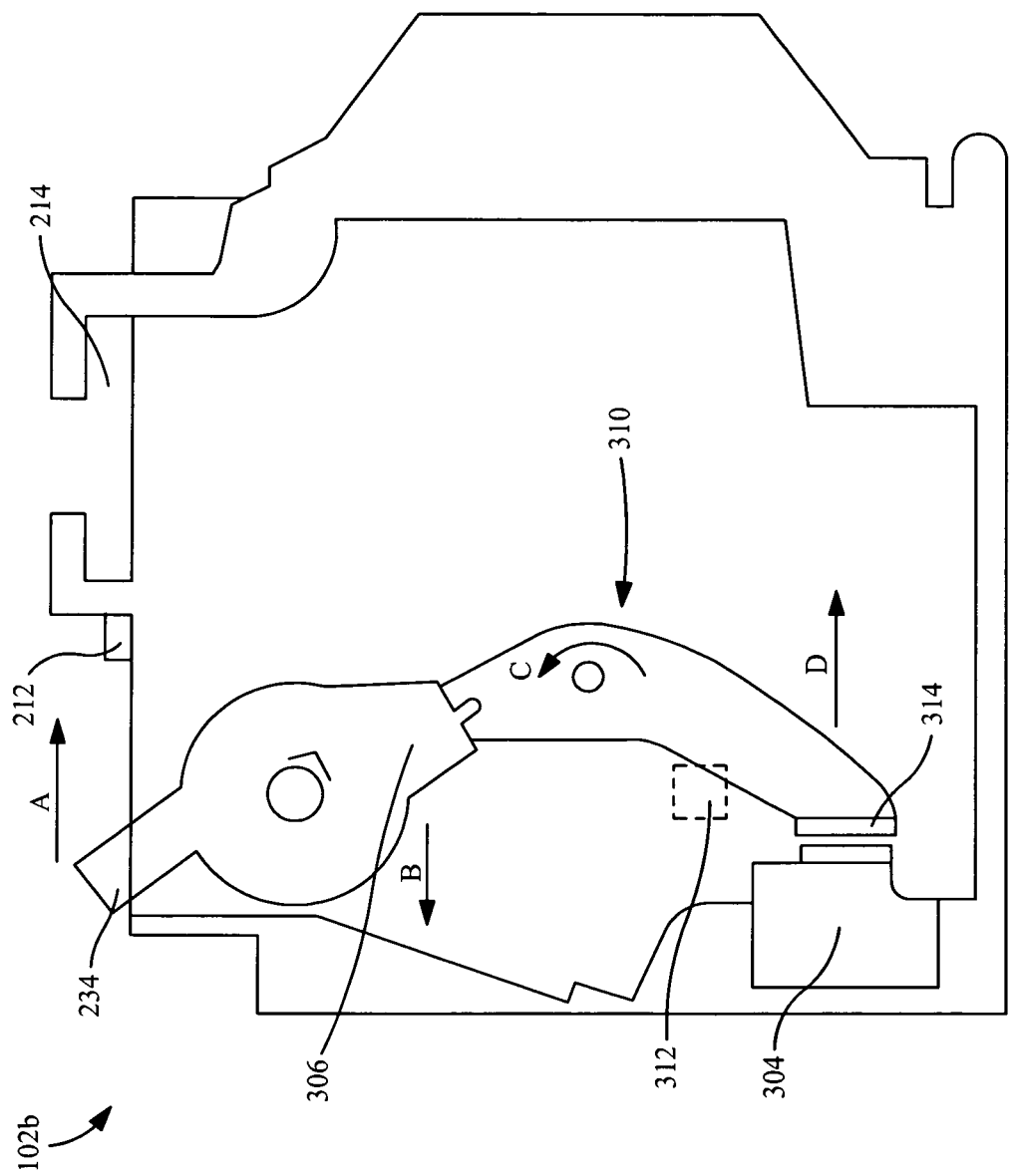
FIG. 3a is a side perspective view of the circuit breaker contact features for use with an exemplary ICB utilizing a latching actuator according to the present invention.
Figure 3B:
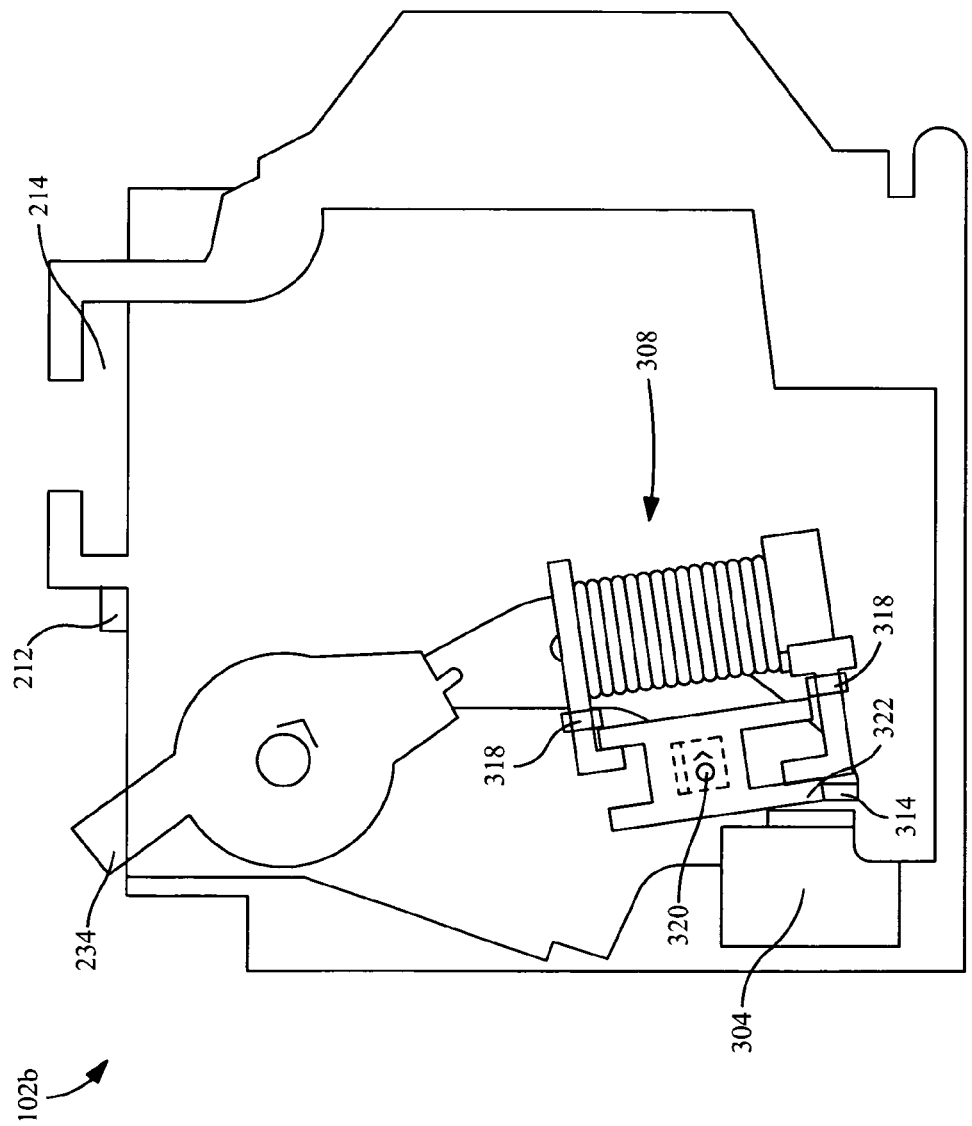
FIG. 3b is a side perspective view of the actuator features of an exemplary ICB utilizing a latching actuator according to the present invention.

FIG. 3a is a block diagram illustrating, in more detail, the various components of an exemplary ICB102b utilizing a latching actuator 308 (see FIG. 3b).

The actuator-activated ICB 102b may also advantageously comprise an LED light 212 and a push button switch 214 as discussed with regard to the relay-activated ICB 102a. Other components of the relay-activated ICB 102b well known in the art are illustrated as well.

The actuator-activated ICB 102b generally comprises a toggle switch 234 having an associated switch pivot arm 306. The pivot arm 306 of the toggle switch 234 is adapted to interact with and cause a physical movement of the circuit breaker contact arm 310. However, in this embodiment, an actuator 308 (see FIG. 3b) may also cause the physical movement of the contact arm 310 without prior movement of the toggle switch 234 as will be discussed below. The circuit breaker contact arm 310, when physically moved, causes the contact ends 314 to come into and out of contact with the stationary line input contact 304; which completes and interrupts the circuit associated with the ICB 102b respectively.

As discussed above, one mechanism by which the contact is physically moved comprises a user physically manipulating the toggle switch 234. As depicted, a user may cause the toggle switch 234 to be moved in direction A, this movement causes the pivot arm 306 to rotate and travel in the direction B. Because the switch pivot arm 306 is physically connected to the contact pivot arm 310, the contact arm 310 is rotated about its pivot in the direction given by C. This rotation causes the contact end 314 of the contact arm 310 to move in direction D, thus toward the stationary line input contact 304 and thereby causes completion of the circuit. It is appreciated that a fault will reverse the directions of movement listed by A, B, C and D and, in that situation, the contact end 314 is moved away from the line contact 304 and the circuit is interrupted.

FIG. 3a also illustrates the access aperture 312. The access aperture 312 advantageously provides access to the inner housing divider for access to open breaker contacts. The access aperture 312 generally comprises a hole in the housing center divider (not shown) and top cover (not shown) will be discussed in further detail below with regard to FIG. 3b.

Referring now to FIG. 3b, the actuator-activated ICB 102b is depicted having a magnetically latching actuator 308 disposed therein. The actuator 308 of the illustrated embodiment is disposed in a manner which does not affect a user's ability to physically manipulate the toggle switch 234. The actuator 308 further comprises ears 318 which fit into notches in the center housing divider (not shown) and top cover (not shown); thereby holding it into position above the contact body 312. The actuator 308 also comprises a pivot 320 which is adapted to insert into the access aperture 312, this configuration advantageously forces and holds the actuator into the desired "open" position while permitting the actuator pivot 320 to cause an actuator arm 322 to rotate, pushing the contact end 314 away from the stationary contact 304 and interrupting the circuit.

Figure 3C:
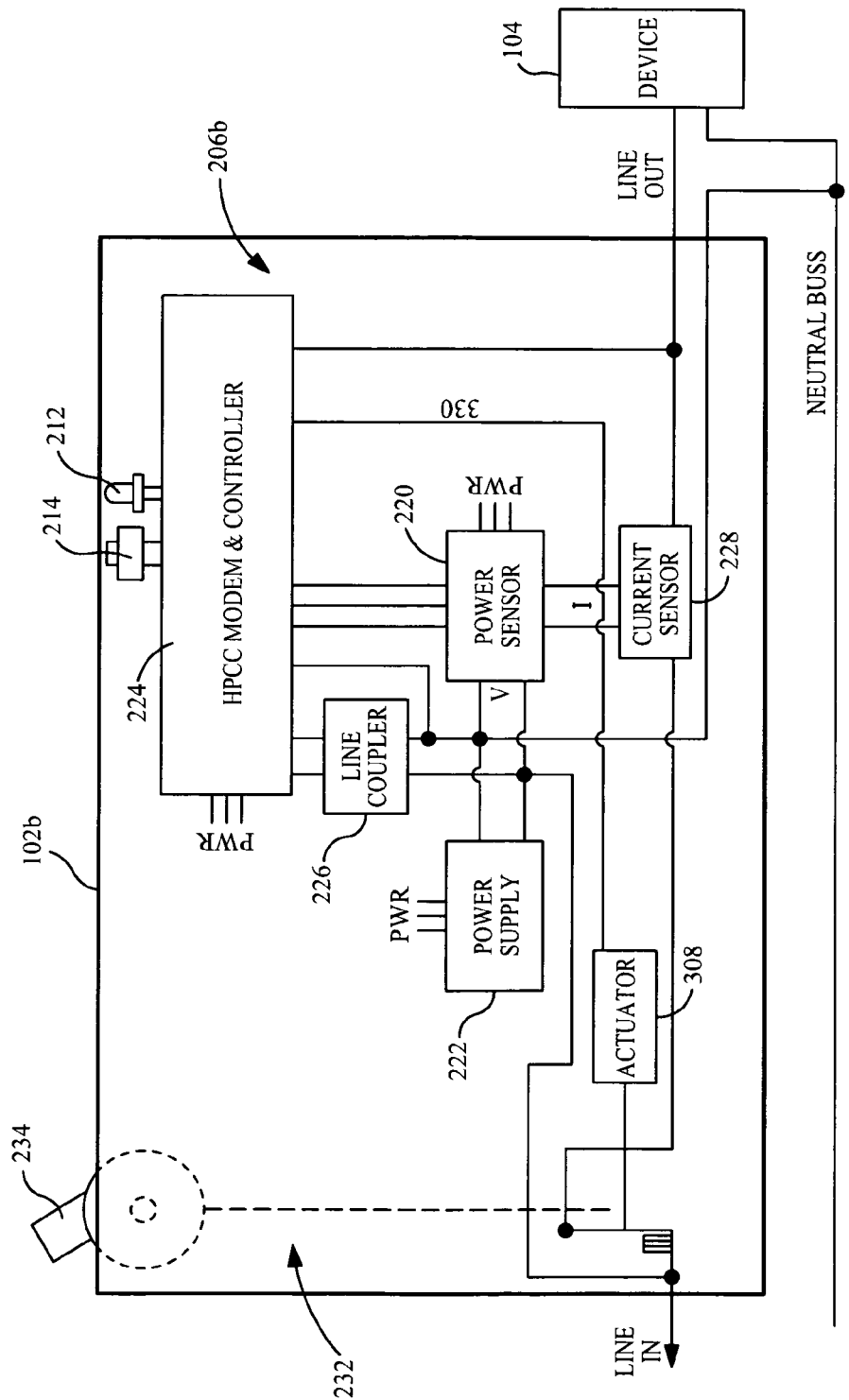
FIG. 3c is a block diagram of an exemplary PCB assembly for use with an exemplary ICB utilizing a latching actuator according to the present invention.

FIG. 3c illustrates the circuitry present on the printed circuit board assembly 206b of the actuator-activated ICB 102b embodiment discussed above. As illustrated, the PCB circuitry comprises an off-line power supply 222 disposed thereon. The off-line power supply 222 provides power for the controller 224 and the power sensor 220.

The assembly 206b further comprises a low-frequency AC power supply network (e.g., HomePlug or comparable powerline system) system which is depicted by its controller sub-board 224. The controller 224 has a transmit/receive coupling to the line and neutral using T1, a toroid transformer. However, as noted above, other powerline communications approaches may also be used to control the breaker.

A power sensor sub-board 220 which is adapted to monitor (i.e. sense) power usage is also disposed in the ICB 102b. The power sensor 220 in this embodiment is an integrated circuit (IC), ADE7753, designed for power measuring. The power sensed is communicated by a "SPI" port 402 to the controller 224. The controller 224 can collect and manage the watt-hours used and also provide voltage, current, temperature, frequency and power factor data. R43 is the shunt to measure the load current; however, a current sensor transformer or a Rogowski coil may be advantageously utilized as well.

The power sensor 220 is also, in one embodiment, adapted to measure for an output to estimate whether the devices attached to that ICB 102b are switched on or off. The estimate may be based in part on power usage in that certain states correspond to certain current usage. Thus, in an example where three devices 104 are on one outlet (via a power strip for example), a certain power usage states would correspond to there being no devices 104 on, only one device 104 on, two devices 104 on, and all three devices 104 on. The ICB 102b, via its memory, may be adapted to know the threshold power usages for each state. The ICB 102b may know the states by preprogramming the ICB 102b for the devices associated with each circuit; or, alternatively, the ICB 102b may have preprogrammed threshold values for certain devices 104. In yet another embodiment, the ICB 102b would be adapted to communicate with devices 104 by sending data over power. Accordingly, "smart" appliances would be adapted to transmit signals to the ICB 102b which is adapted to process the voltage wave form.

The PCB assembly 206b may also advantageously comprise a line coupler 226 and/or current sensor 228.

The PCB assembly 206b of the actuator-activated ICB 102b also depicts the above described association of the LED light 212 and push button switch 214 with the PCB 206b. As is illustrated, both the LED light 212 and the switch 214 are powered by the power supply 222. Also as discussed above, the switch 214 permits a user or other activation device to physically cause the completion or interruption of the circuit.

As is well known in the electronic arts, the actuator 308 is adapted to act as an electric switch that physically move (thus pushing open and close the contact arm 310) under control of an actuator controlling circuit 330 which is disposed on the printed circuit board 206b of the ICB 102b. The PCB assembly 206b depicts the actuator controlling circuit 330 and its association to the actuator 308 as discussed. The actuator 308 may control whether or not the circuit is complete via the controlling circuit 330 in a separate (and/or remote) mechanism than the user-activated push button switch 214 (which may be primarily utilized as a "test" button).

The actuator 308 is in the illustrated embodiment driven via TRIACs, Q1/Q2, through diodes since the magnetic latching requires a DC pulse. It is appreciated, however, that other actuators (not shown) may be utilized consistent with the present invention, and such other actuators may require AC (no diodes). The R9 circuit senses for output to verify that the actuator 308 has switched, and the R11. circuit indicates the 60 Hz zero-crossings to determine proper switching time.

Also depicted in FIG. 3c is the standard circuit breaker 232 having toggle switch 234. It is appreciated that the ICB 102b of the present embodiment is adapted to work in conjunction with the existing circuit breaker 232, such that the controller 224 may override the standard circuit breaker 232 and cause a fault condition, and/or may restore the breaker from a fault condition.

Figure 4:
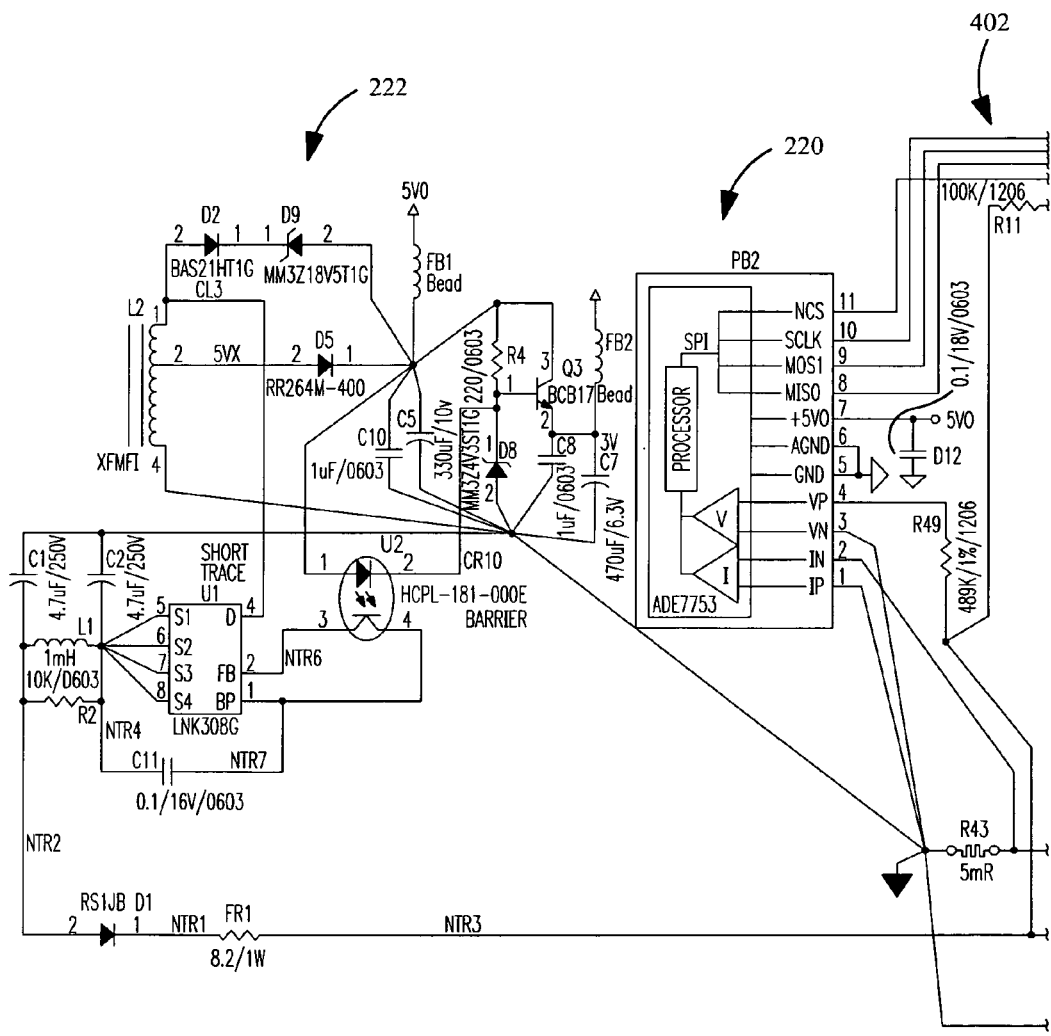
FIG. 4 is a schematic diagram of an exemplary PCB assembly for use with an exemplary ICB utilizing either a latching relay or a latching actuator according to the present invention.
Figure 4:
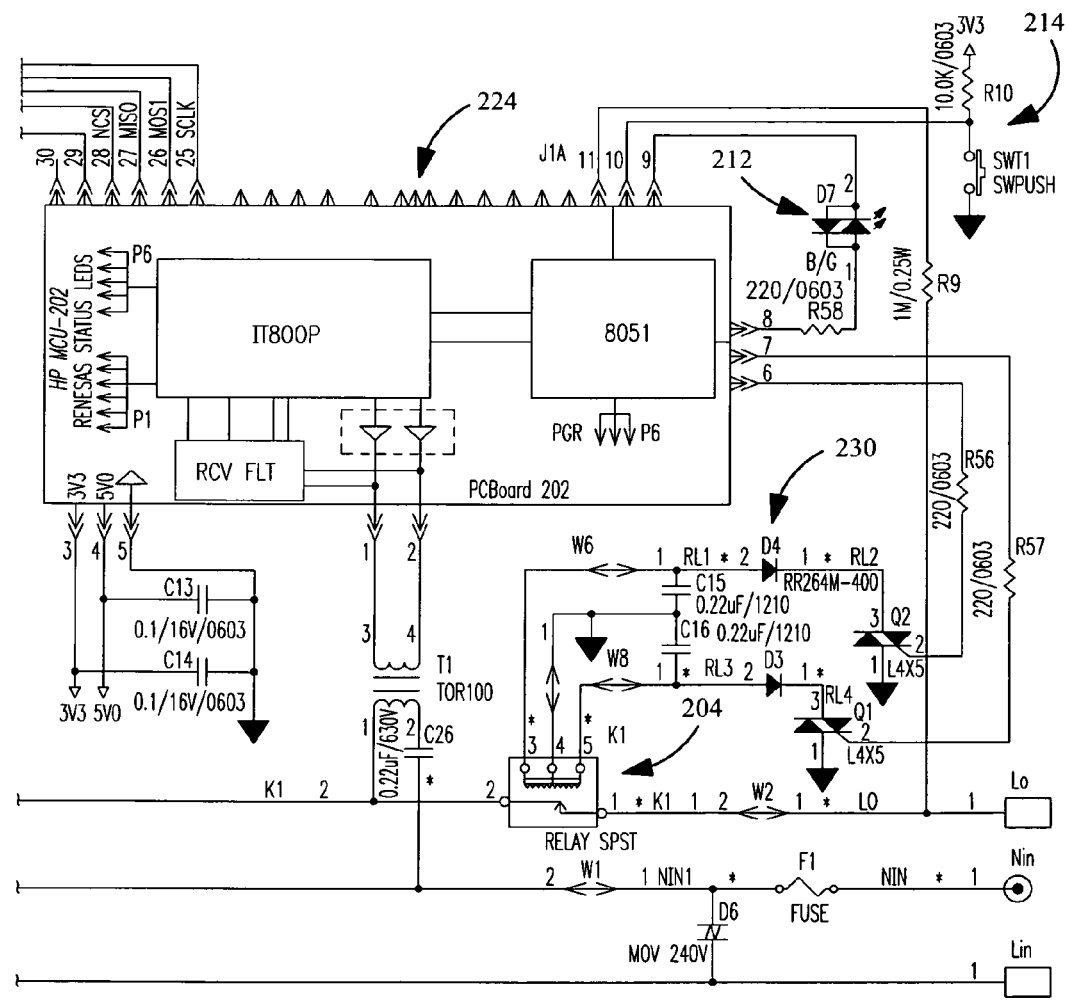

FIG. 4 illustrates another exemplary printed circuit board assembly 206c. Although the illustrated embodiment depicts relay drivers 230 and a magnetic latching relay 204, it will be appreciated that the assembly 206c may also be utilized with an actuator-activated ICB 102b as well.

The PCB assembly 206c comprises a PCB (not shown) having an off-line power supply 222 disposed thereon. The power supply 222 of the illustrated embodiment is adapted to generate 5V and 3.3V of power. However, it will be appreciated that other power supply types, including on line or line interactive supplies and those generating other voltage amounts may be utilized consistent with the present invention.

The power supply for use in the above-described embodiment is a non-isolated 120VAC to +5VDC flyback type converter using a low cost flyback converter IC. The D1 rectifier charges up C1 and C2 to −150 VDC which is further filtered by L1. L2 forms an auto type transformer to step up the output current. D5 charges C6. The D8 4.3V zener is about 4V at the low operating current and the U2 opto-isolator conducts at about 5V output and provides the feedback to the U1 converter to maintain the 5V output regulation. The 3.3V is generated by a simple emitter follower which is, conveniently, biased by the 4.3 v (4V) plus the 0.7V Q3 transistor producing the 3.3VDC output voltage. The ferrite beads FB1 and FB2 prevent the switching spikes from leaving the supply portion of the circuit. It is also appreciated that an isolated supply can be utilized as well by simply replacing the L2 with an isolation transformer and using a more appropriate converter U1, such as an exemplary LNK362 device of the type well known in the art.

The assembly 206c also comprises a power sensor 220 adapted to monitor the power utilization of the devices 104 associated with the circuit. The power sensor 220 of the illustrated embodiment is an integrated circuit (IC) such as an Analog Devices ADE7753 or similar designed for power measuring, and communicates by an "SPI" port 402 with the controller 224. The controller 224 can collect and manage the watt-hours used, and also provide voltage and current data or other relevant data. R43 comprises the shunt used to measure the load current. In one embodiment, the power sensor 220 is adapted to measure for an output to ensure that the output is switched on or off.

The controller 224 in the illustrated embodiment comprises an HPCC control module of the type known in the home power/automation arts; however, it will be appreciated that any low-frequency AC power supply network system or comparable powerline system may be readily substituted to impart the requisite control functions. For example, the controller 224 may utilize radio frequency (RF) waves to communicate with devices 104, wireless forms of communication, or infrared (IR) or other light based communication. The exemplary controller 224 consists of an HPCC modem with a controller function, and has a transmit/receive coupling to the line and neutral using T1, a toroid transformer. However, as noted above, other powerline communications may also be used to control the breaker.

As previously indicated, the aforementioned PCB assembly 206c may be utilized in conjunction with an actuator-activated ICB 102b via the same or similar approach to that described above with regard to the relay-activated ICB 102b embodiment.

Low-Wattage Embodiment

Figure 5:
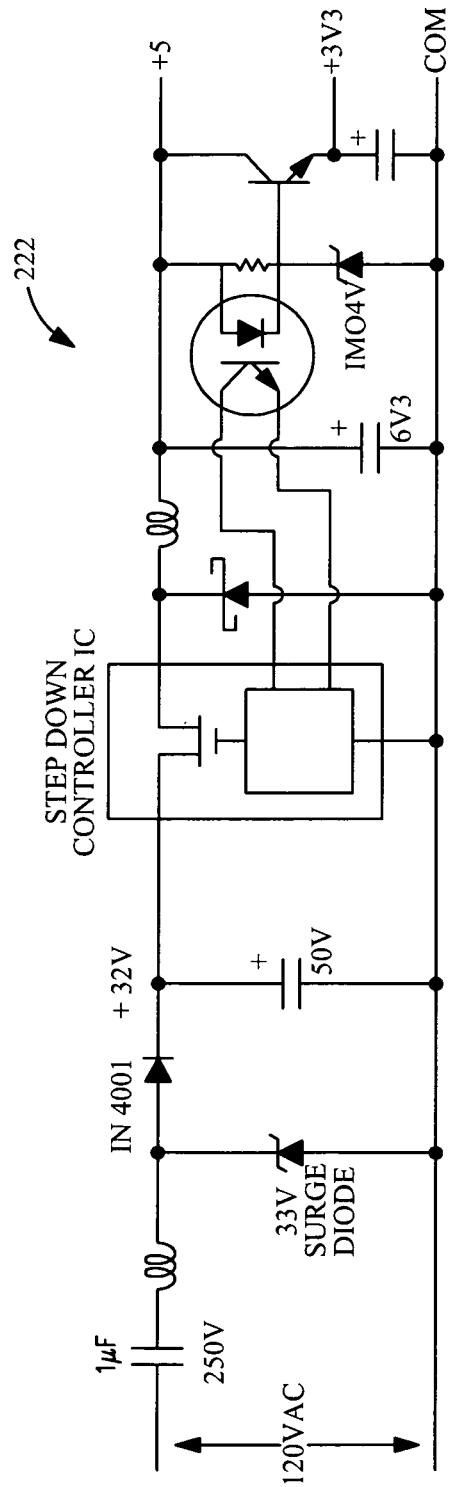
FIG. 5 is a schematic diagram of exemplary low-power off-line circuitry for use with an exemplary ICB utilizing either a latching relay or a latching actuator according to the present invention.

As illustrated in FIG. 5, the above described exemplary embodiment of the ICB system 100 utilizes a low power off-line (1 Watt) supply 222. The low-wattage embodiment is advantageous because inter alia by reducing the power used for the driver, the power supply (such as by not requiring a transformer or tapped inductor) complexity, size, and cost are also reduced. In the illustrated embodiment, the power supply 222 does not utilize a tapped inductor. The power supply 22 of the illustrated embodiment uses a series capacitor with a zener diode and rectifier to reduce the input AC voltage to approximately 30V. A 30 V low-voltage converter is then utilized to generate 5V or 3.3 V of power as needed. It is appreciated, however, that other arrangements and voltage generating configurations may be utilized consistent with the present invention. It is further appreciated that the low power assembly may be incorporated into either a relay-activated 102a or actuator-activated ICB 102b.

Bridged Embodiment

In yet another embodiment, depicted in FIGS. 6a-d, two or more ICBs 102 (either relay-activated 102a or actuator-activated 102b) may be bridged (or ganged) together with a bar or bracket. As is well known in the electrical arts, joining three breakers (in this embodiment three ICBs 102) facilitates three-phase applications; however, other applications utilizing more or fewer ICBs 102, whether used in a common system or distinct circuits, are also contemplated.

Figure 6A:
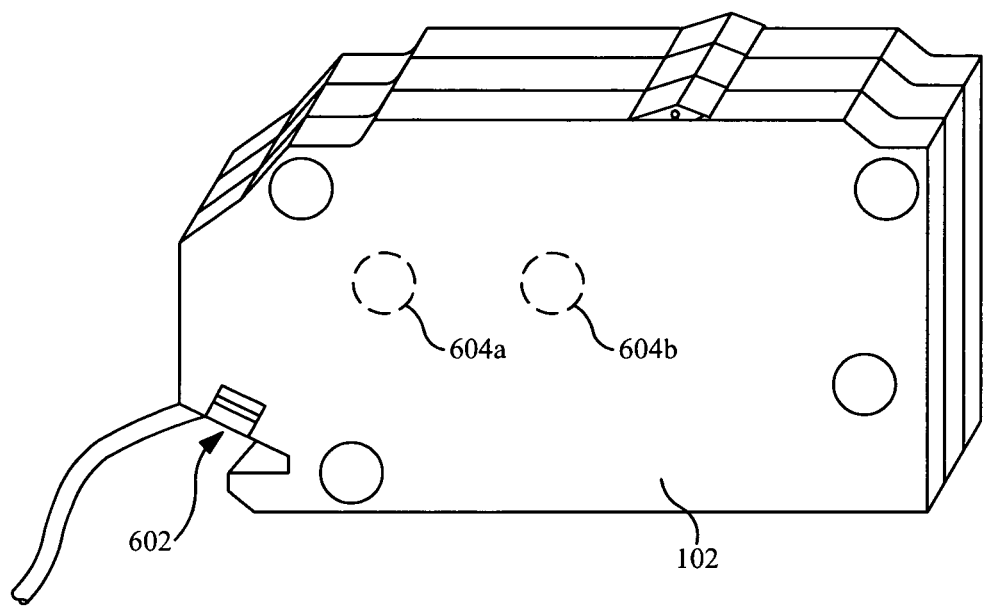
FIG. 6a is side perspective view of an exemplary bridged ICB according to the present invention.

FIG. 6a illustrates a side perspective view of exemplary three-phase ICB 102 according to the present invention. As illustrated, the individual ICB 102 each comprise circuit breaker toggle switches 234 which are adapted to move their respective contacts within the ICB 102 to an open or closed position as described above. The toggle switches 234 may also be moved by the relay 204 or actuator 308, which are controlled by the controller 224 disposed within the ICB 102 as well. It is appreciated that to create the three-phase bridged ICB 102, a bridge or other mechanism linking the toggle switches 234 to one another is needed, as described below. The individual ICBs 102 of the three-phase bridged ICB 102 are attached or ganged, in the illustrated embodiment, by a clip 602. The clip 602 comprises a small protrusion which is adapted to fit within an opening (not shown) on a second ICB 102. Each ICB 102 will therefore comprise at least one protruding clip 602 on one face, and an opening on the opposite face. Thus, several ICBs 102 may be aligned and snapped together. Apertures 604a and 604b may also be drilled or knocked out for tying the breaker trip levers together or for routing neutral wires (or other wires) in order to facilitate current/voltage measurements and/or to implement GFI and/or AFIC functions within the apparatus.

Figure 6B:
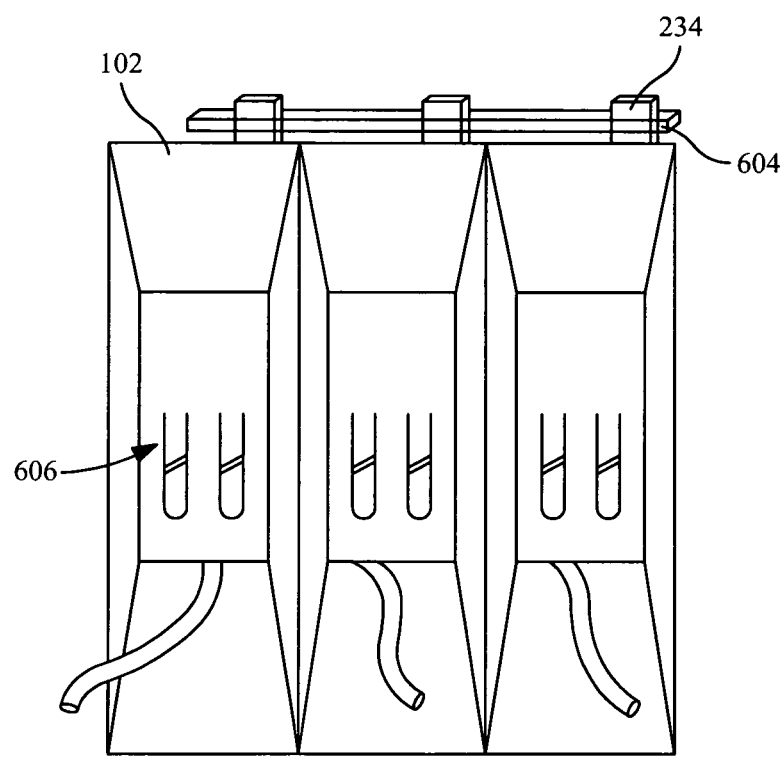
FIG. 6b is a front perspective view of an exemplary bridged ICB according to the present invention.

Referring now to FIG. 6b, a front perspective view of the exemplary bridged ICB 102 of FIG. 6a is given. The load terminals 606 of each ICB 102 are depicted. Also illustrated is the bridge 604 which links the toggle switches 234 of the ICBs 102. Thus, when the relay 204 or actuator 308 of one ICB 102 interrupts the circuit (in the manner discussed above) and moves the toggle switch 234 of one ICB 102 to the open position (with regard to the contacts), the toggle switches 234 of all of the ICB 102 are moved to the open position. Further, because the bridge 604 links each of the toggle switches 234, it is noted that actual manual manipulation of any one of the bridged switches 234 results in movement of all of the bridged switches 234.

The bridge 604 would, in one example, connect the switches 234 of the ICBs 102 together to form a dual 220V breaker, which may employed for example in pool pumps, spas, water heaters, etc. Other arrangements and applications are also contemplated by the present disclosure.

Figure 6C:
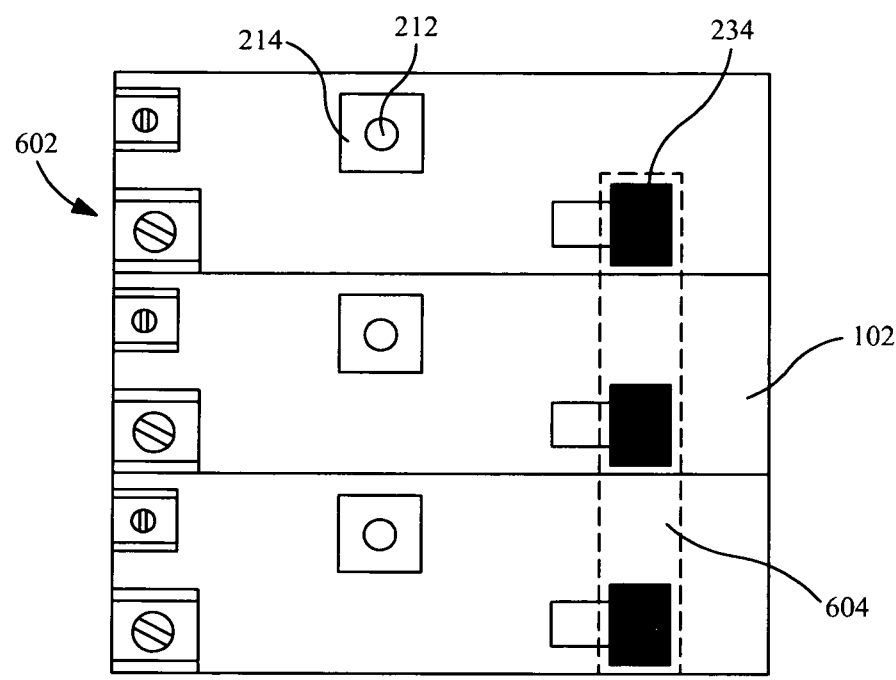
FIG. 6c is a top elevational view of an exemplary bridged ICB according to the present invention.

FIG. 6c is a top elevational view of an exemplary bridged ICB 102 according to the present invention. As depicted, the bridge 604 links the toggle switches 234 of the ICBs 102. The aforementioned clip 602 features of the ICBs 102 are also depicted.

Figure 6D:
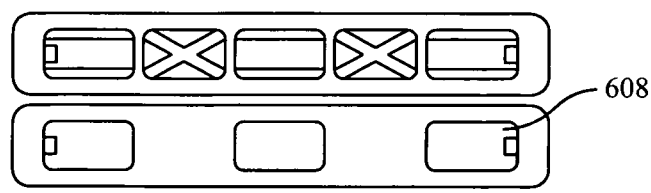
FIG. 6d is an elevational view of the bottom and top of an exemplary bridge for use with the exemplary bridged ICB.

FIG. 6d is an elevational view of the bottom and top of an exemplary bridge 604 for use with the exemplary ganged ICB 102. As illustrated, the exemplary bridge 604 comprises several apertures 608 for receiving the toggle switches 234 of the ICBs 102.

In another embodiment, two ICB 102 are linked together by riveting or snapping; a bridge 604 is then used to link the ICB 102 toggle switches 234 (as above), and software/firmware present within the ICB 102 or ICB interface is used to tie the controllers 224 of each ICB 102 together so that they operate the phases together as well as measure power, calculate power, and perform other above stated functions.

The overall effect of the bridged ICB 102 is to link together two or more separate control circuits. This gives the individual devices 104 connected via the bridge 604, one unified controller function. In another embodiment, only one controller 224 is utilized; this embodiment also serves to reduce costs, in that fewer PCB assemblies 206 (206a, 206b, or 206c) would be required to control more than one device 104. It is also appreciated that one controller 224 may be utilized with separate current sensors 228 and/or power sensors 220 for each ICB 102 connected in phase.

Additional Functions

As discussed above, an ICB 102 generally comprises a power supply, a controller, a power sensor, and various circuit breaker mechanical components. Various other components may also be used in addition to the aforementioned components to impart various functions to the ICB system 100. As used below, the ICB 102 is used interchangeably to refer to both the relay-activated ICB 102a and the actuator-activated ICB 102b.

As discussed above, the ICB 102 of the present invention may be adapted to include power measuring functionality, including the ability to measure both positive and negative accumulation of kilowatt-hours. The power measuring device (power sensor 220) may be utilized in conjunction with a clock function (e.g., built-in real time clock, or periodically updated software clock) to measure and store the amount of Watt-hours for specified periods, such as during peak times and shortage days. In one embodiment, the periodically updated software clock may be updated daily via external communication. Thus, a user may be informed of the actual costs of operation for devices 104 during peak periods, as well as costs during off-peak hours. The user may also cause the ICB 102 to automatically shut down or preclude startup during specified periods, such as higher rate periods, the shut down being accomplished via causing the relay or breaker to open during these periods or open only when a user attempts to use the devices 104 during this period; this may be especially advantageous for devices 104 which consume significant power such as, for example, electric water heaters. The present invention also contemplates that a user can schedule various operations or uses around the rate schedule for their electricity; i.e., certain devices will only come on or be permitted to be started at off-peak hours, such as air conditioners or electric clothes dryers.

A timer function may also be included so that power will automatically by shut down by the ICB 102 at user-specified times.

In yet another embodiment, the power sensor 220 enables a user to set overload or dangerous conditions under which the ICB 102 will automatically shut down associated devices 104. For example, the user may indicate that if kilowatt-hours are greater than some threshold level, the ICB 102 will shut down and/or signal another device (via an alarm or alert message). The conditions specified may be measured by, inter alia, a current sensor or the like, or a thermal function.

In another embodiment, the power sensor 220 allows the ICB 102 to perform routine tests on the devices 104 associated therewith. In one variant, this function is accomplished by first characterizing the signature of the correct working appliance. When the power signature changes (based on, e.g., a periodic comparison or evaluation), the ICB 102 alerts the user or even a remote monitoring facility that the device 104 is malfunctioning. For example, the ICB 102 may perform a test on a refrigerator/freezer to obtain a power signature representing the power usage and duty cycle of the appliance under certain ambient conditions. This may be normalized or averaged if desired to obtain "typical" usage parameters, even on a daily or seasonal basis (e.g., "Summer profile", "Weekend profile", etc.). Later, when the ICB 102 receives power sensor 220 data that indicates that the duty cycle has changed significantly (e.g., the refrigerator compressor is being constantly run), it could inform the user of the condition, and even a suggested cause, such as that the door may be open, the Freon is low, a belt is loose, etc. When the ICB 102 receives power sensor 220 data that no power is being utilized by the appliance, it would inform the user that the appliance has prospectively failed, or that another problem may exist (i.e., the plug has been pulled from the wall socket, the on/off switch inside the refrigerator has been inadvertently switched to off, etc.).

Other power sensor 220 functions are also readily appreciated by those of ordinary skill given the disclosure herein, such as for example and without limitation detection of current transients or peaks which may indicate intermittent shorting or electrical fault within the device, or selecting between two competing sources or devices based on economics.

Monitoring

In one embodiment, the abovementioned components enable the ICB 102 to measure and accumulate data regarding the amounts of power used on a particular load or appliance per time of day. Accordingly, the ICB 102 of this embodiment would also include a non-volatile memory device (not shown); such memory may include, inter alia, a read-only memory, a flash memory, a magnetic computer storage devices (e.g. hard disks, floppy disk drives, and magnetic tape), or an optical disc drive. However, in an alternative embodiment, such memory device would be located remote to the ICB 102, though in communication therewith. The memory device of this embodiment would also advantageously comprise a mechanism for applying a time stamp to the data stored. In yet another embodiment, the memory device would be further adapted to manage accumulated information from an ICB 102 for more than one cost rate. For example, the ICB 102 may store tiered energy rates (different rates based on one or more factors or device types) and information regarding the categories of devices or load rates (based on time of day). In one example, different rates may apply to devices having medical or non-profit uses, HVAC devices, entertainment or luxury devices, etc. Such mechanisms are well known in the electronic arts and thus will not be discussed in further detail herein.

Gathering and Examining Historical Data

In another embodiment, the abovementioned components enable the ICB 102 to give the user information regarding how much power a particular device 104 is consuming and costing by measuring and accumulating the power used for that particular device 104 via a user interface. The ICB 102 may also use the information to calculate mathematical functions such as how much energy has been used and/or estimate the energy that will be used in the next week, month, or other period. (Alternatively, the ability to calculate may be reserved to the user interface upon receipt of appropriate information.) The ICB 1052 may also utilize stored rate information to calculate a monthly or periodic power bill or estimation based on for example MTD usage, tiered energy rates, taxes, additional fees, etc. The historical data may also be used to determine usage above "normal usage" which may then be indicative of device 104 malfunctioning. This information may encourage the user to take appropriate action to reduce the power consumption and better manage the particular devices' 104 usage. As discussed above, the ICB 102 of this embodiment would advantageously comprise a non-volatile memory device in order to enable the ICB 102 to collect and store the power consumption data. The data recorded may comprise, inter alia, factory calibration information, power, current, voltage, power factor, harmonics, trigger, load signature (including loss of power information and/or actuation date/time), general date/time log information, as well as tiered power rates for the month/day/period. The tiered power rates refer to instances where the rates charged for power usage depend on one or more factors such as time of day or by creating levels of service having different rates (e.g., more than a certain number of watt-hours used places a consumer in a higher-rated tier). Including this information enables ICB 102 to incorporate billing functionality e.g., the ICB 102 calculates how much a customer will owe based on usage and tiered rates. The ICB 102 may also be able to differentiate power usage from among several users such as in a multiple dwelling unit situation (e.g., apartment complex, condominium complex, etc.) and bill individual users from a single ICB 102. The ICB 102 will also comprise a time stamp mechanism to adequately represent the data collected as a function of the particular day/time the device 104 was used.

Further, it would be advantageous for the ICB 102 of the present invention to comprise a user interface having one or more applications adapted to run thereon permitting the graphical or other representation of the collected data. The user interface will be discussed in further detail below.

Fault Indication

By combining power, voltage, current, and power factor data with the device history and/or the state of the device, the system can provide fault indications and indicate preventive maintenance and/or alert the user or initiate instruction to the device 104, dealer, or manufacturer for services required. For example, if system 100 is used having an HVAC unit connected to the ICB 102 (i.e. an HVAC as a "device" 104); when the HVAC fan is turned on the ICB 102 would note a particular level of power used being indicative of a functioning fan. Subsequently, when the ICB 102 measures the use of power or drain current as low, the system 100 would know that this is indicative of a dirty filter. Similarly, the power utilization of the compressor would be indicative of functionality, such as by indicating that the compressor is low on Freon.

According to this embodiment, the ICB 102 would advantageously utilize a non-volatile memory device as discussed above, as well as the aforementioned time stamp mechanism. The ICB 102 of this embodiment would also further comprise stored comparison data on the memory device, such that the controller would have a predetermined power consumption level (factory default for comparison and/or calibration) to measure current consumption levels against in order to diagnose a problem and/or check circuit functionality. The ICB 102 would also further comprise an alert mechanism such as an alarm or indicator light to notify a user that a device is not performing on par with other working devices. Lastly, according to this embodiment, it may be advantageous for the ICB system 100 to further comprise a user interface adapted to give a user information regarding the fault detected. The user interface will be discussed in detail below.

Timer

In another embodiment, an internal timer can be set to delay the turn on or turn off of a device, i.e., during peak power consumption times during the day, certain devices might automatically be turned off or turning them on may be delayed. For example, it is not energy efficient to run dryers and dishwashers during the day in summer, accordingly, a user may set these devices to turn off during the afternoon hours and not be permitted to turn on again until after those hours have passed. The ICB 102 may automatically restore the devices which were set to turn off during the peak period. Alternatively, a command may be sent (e.g. from the utility company) to the ICB system 100 of the present invention to turn off specific devices 104 for a prescribed period and then to automatically turn these back on after the prescribed period.

This embodiment would require the ICB 102 to further comprise a timer or other mechanism enabling the IBC 102 to understand time restraints, a mechanism for reactivating devices (i.e. internal circuitry for activating the actuator 308 or relay 204 so as to re-establish a contact in that circuit such as by closing the relay or breaker at specific times), and a mechanism for receiving commands to the controller. The mechanism for receiving commands may be a wired or wireless connection such as those well known in the arts.

Brown-Out Conditions

The embodiment discussed above may advantageously be employed to enable the power sensor 220, 406 to monitor for brown-out conditions, and use the low voltage with the resulting current increase to cause the ICB 102 to switch off the load to protect the vulnerable device 104. According to this embodiment, the ICB 102 would further comprise a non-volatile memory adapted to store data regarding the conditions under which the ICB 102 should shut down certain loads to protect a device 104 (such as a compressor or other motor) termed "trigger points"; the ICB 102 would also store data regarding which devices 104 would require protection and which may be shut down and/or data regarding the trigger points for shut down including thresholds for power, power factor, voltage, current, frequency, cost, harmonics, etc. The controller would then utilize this data to determine which circuits to interrupt.

Generating Records and Technical Support

The ICB 102 may also be adapted to generate records when a circuit is interrupted so that a technician or other user may identify when an interruption was caused by the ICB 102 itself and when one was manually produced and/or records of general power usage including, inter alia, wave forms, etc. Further, in another embodiment, the ICB 102 would be adapted to provide a real-time download for service technicians regarding the generated records demonstrating the interruptions to the circuit as discussed above and/or data regarding power, power factor, frequency, rates, and tiered rates, etc. Accordingly, the ICB 102 would comprise a storage medium and means to transmit the accumulated data to a user; this function will be discussed below with regard to the user interface.

Ground Fault Circuit Interrupter (GCFI) and Arc Fault Interrupter (AFI)

In yet another embodiment, in order to comply with certain building codes, a Ground Fault Circuit Interrupter (GFCI) or an Arc Fault Interrupter (AFI) may optionally be included in the ICB 102. As these functions are well known in the art, they will not be discussed in further detail herein. However, data relating to their use (e.g., time tripped, etc.) may be stored by the ICB and forwarded for subsequent analysis.

User Interface

In another embodiment (not shown), the ICB 102 further comprises a user interface 106. The user interface 106 may be located remote from the ICB 102 in one embodiment, and may comprise a computer application adapted to run on a computer device having a processor with associated storage, a display, and user input. The computer application will be discussed in greater detail below. The computer device would also advantageously comprise a means for retrieving data directly or indirectly from the ICB 102. These means may include for example Bluetooth, Ethernet, WiFi, LAN, etc. and may include any personal computer apparatus including, inter alia, laptop computers, cellular/digital telephones, PDA, etc.

In one exemplary embodiment, the ICB 102 of the present invention is adapted to operate with a home automation device such as that described in co-owned, co-pending U.S. patent application Ser. No. 10/986,234 filed Nov. 9, 2004 and entitled "Improved automation apparatus and methods" which is herein incorporated by reference in its entirety. The home automation device of this invention seeks to improve and simplify the premises (e.g. home) automation process through a variety of advantageous design features, including, inter alia, integrating most of the functions within a compact, unitary multi-function controller (e.g., server). The foregoing approach also provides a high level of system scalability so that each particular installation can be readily configured to meet the customer's needs at the lowest cost and with the least complexity, while also simultaneously permitting expansion to cover literally every type of function relating to the structure including, e.g., HVAC/environmental control, security, entertainment, energy conservation and management, and safety. In yet another embodiment, the ICB 102 of the present invention is adapted to operate with a home automation device such as that described in co-owned, co-pending U.S. patent application Ser. No. 11/218,899 filed Sep. 2, 2005 and entitled "Universal control apparatus and methods". Also incorporated herein by reference in its entirety, the foregoing describes a home automation system which allows for flexible and efficient control of one or more functions and/or aesthetics within the premises (or in associated structures or areas) at a low cost. The home automation system satisfies these needs by providing, inter alia, a "universal" control apparatus architecture which allows for both a great degree of configurability (whether by the end-user, the installer, or the manufacturer) as well as substantial uniformity between the components used for the various configurations.

Accordingly, in one such embodiment, the ICB 102 of the present invention would be adapted to send information to and receive commands from a home automation device such as those described above; and, in yet another embodiment, would be adapted to provide the automation device the ability to control the ICB 102 devices 104 such as a thermostat, etc. so as to allow a user to set a temperature, etc. from one remote device. As discussed above, communication between the ICB 102 and user interface, including a home automation device, may be accomplished via wired or wireless connections including, inter alia, WiFi or Bluetooth capabilities on the ICB 102 itself.

Alternatively, the user interface 106 may comprise a web-based application. The web-based application would be stored and run from a remote server. According to this embodiment, the application would be accessible to a user via a secure Internet connection. Such security may be imparted by a log-in and password or by registering accessing devices with a registration server in communication with the application server. The web-based application may also "lock out" a user if an incorrect password, etc. is supplied more than a certain number of times, in order to reduce tampering with the system by unauthorized users. Certain functions may also be disabled to an unauthorized user via a manufacturer seal or other device.

In yet another embodiment, the user interface 106 is located directly on the ICB 102. Accordingly, the ICB 102 would be adapted to comprise at least a microprocessor, storage, a display element and a user input element. The microprocessor of this embodiment would be adapted to run various computer applications, which will be discussed in greater detail below.

Software Architecture

As discussed above, the relay-activated ICB 102*a* and the actuator-activated ICB 102*b* of the present invention are adapted to perform various functions including, inter alia, monitoring devices, gathering information and examining historical data about the monitored devices, indicating faults with the monitored devices (e.g., records wave forms voltage, current, power, etc. in buffer for analysis after a breaker is tripped), having a timer or time stamp mechanism, determining brown-out conditions, generating records and technical support real-time downloads, and incorporating GFCI and AFI functions. Accordingly, the user interface associated with the present invention (whether remote to the ICB, such as running on a personal computer device including a cellular/digital phone, laptop, PDA, etc., directly on the ICB, or a web-based application) will be adapted to include appropriate mechanisms by which a user may receive, access, and evaluate data, receive alerts or alarms or timer indications, and receive information regarding implemented policies during brown-outs, etc. The software would also be adapted to permit a user to compare power-usage data to data stored within the application.

As addressed above, in one embodiment, the software applications are run on a web-based server. In another embodiment, the aforementioned software applications are run on a microprocessor or microcontroller physically located on the ICB 102. According to this embodiment, the software applications must be stored on computer readable media within the ICB 102, such as RAM or other internal storage or memory apparatus.

Alternatively, the software applications may be run on a user's personal computer, laptop, or other computer device. According to this embodiment, the applications would likely be installed onto the computer devices from removable media and would be stored to the internal memory of the device. Communication with the ICB 102 would still be affected via Bluetooth, or other well known mechanism for secure transmission of data, as discussed above.

Network Configurations

As discussed above, one salient aspect of the present invention is the ability of the ICB 102 to communicate with (i.e. send and receive data to and from) a user interface and/or other devices.

In one embodiment a web-based interface is utilized having a server which is implemented using various software applications that are stored in the mass storage device and RAM, and executable to run on processor in communication with the web-based server. These software applications may include, inter alia, a network address translation (NAT) proxy application providing devices connected to the LAN (and having addresses that are not able to be routed on the Internet) with the ability to communicate on the Internet. A web server application including a user interface (UI) for local and remote access and control of a plurality of communications operations is also provided. Other applications running on the server may include network management and control systems (NMCS); an Internet access application providing one or more devices on the LAN with simultaneous access to the Internet through a shared Internet service provider (ISP); an e-mail management application (e.g., unified messaging or the like) providing centralized collection and management of e-mail from multiple e-mail servers; a facsimile receipt, storage and forwarding application providing the premises with centralized reception, storage and forwarding of facsimile data; and a premises automation application providing local and remote access and control of home or premise equipment including appliances, HVAC equipment, lighting, home electronics, etc. as previously described herein.

As described above, the present invention provides methods and apparatus that allow for remote control of and remote receipt of data from an intelligent circuit breaker using a connection to a local area network, WLAN, PAN, or to the Internet. One advantage of the present invention is that the user interface can be comprehensive in nature, so as to provide a user with the ability to collect and analyze historical power usage information, as well as information regarding the status and operation of the devices 104 attached to the system 100.

Methodology

As discussed previously, the load control requirements will likely be placed on existing homes, offices, etc., thus, an economic approach to load shedding and power management is discussed. According to this approach, various components of ICB 102 would be installed into existing circuit breakers.

Figure 7A:
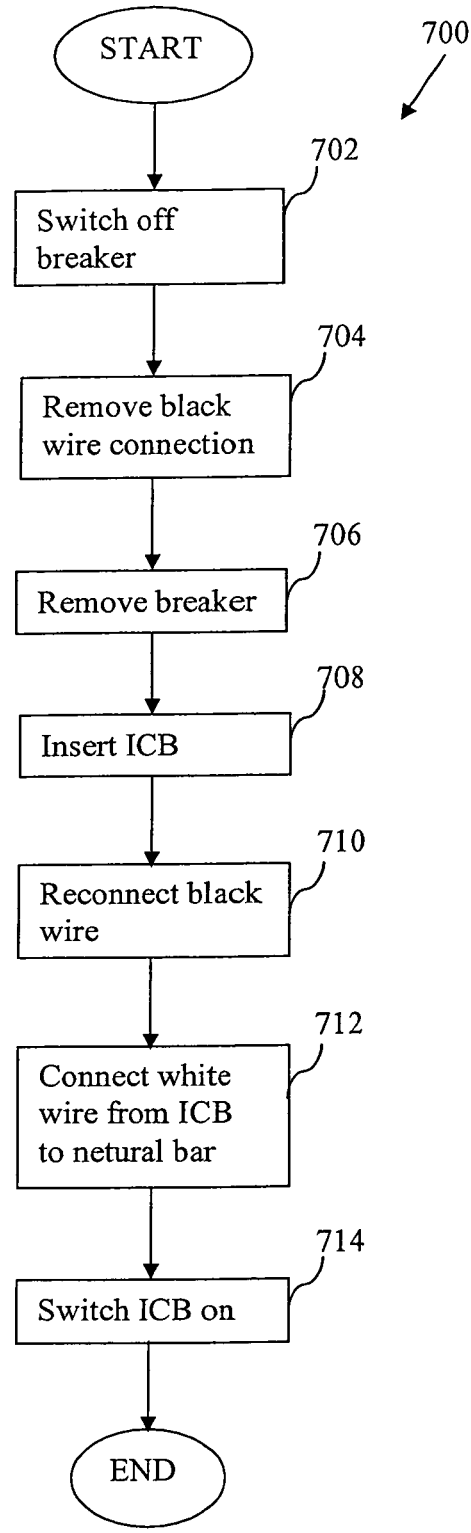
FIG. 7a is a block diagram illustrating an exemplary method of changing an existing circuit breaker to an ICB.

A first exemplary method 700 for changing an existing circuit breaker to an intelligent circuit breaker, ICB 102 is given by FIG. 7a. Per step 702, the technician or user first switches off the particular breaker to be converted. Then, at step 704, the black wire is loosened and pulled free from the breaker. Subsequently, at step 706, the breaker is removed and replaced (at step 708) with the intelligent breaker. Then, step 710, the black wire is reinstalled into the intelligent breaker line terminal. Finally, at step 712, the white wire is installed into the neutral bar and at step 714, the ICB 102 is switched on.

An alternative exemplary method 720 for adapting an existing circuit breaker into an ICB 102 is given by FIG. 7b. It is appreciated that utilization of this method may necessitate the presence of an inspector or other trained professionals. Per step 722, the technician first switches off the breaker to be converted. Then, at step 724, the covering is removed. At step 726, a latching actuator 308 is disposed atop the existing circuit breaker contact arm 310. The actuator 308 is disposed in such a manner so as to be able to break the contact between the existing contact arm and the line contact 304. The actuator 308 may be advantageously held in place via one or more ears 318 and an actuator pivot 320 held into place through an access aperture 312. At step 728, the PCB assembly 206 (206a, 206b, or 206c) is disposed in communication with the actuator 308. Subsequently, at step 730, the cover is replaced on the circuit breaker. Then, at step 732, the breaker is turned back on.

As is evident from the above, the ICB 102 of the present invention comprises modular internal components which may be selectively replaced. This feature permits the invention to be highly cost effective.

Example Applications

Exemplary applications of the foregoing apparatus and methods are now described to further illustrate the various aspects of the invention.

1) The foregoing intelligent circuit breaker is added to a breaker panel to measure high-load devices, or provide sub-metering for tiered billing (e.g., medical/not-profit/commercial/luxury), or simply partitioning multi-dwelling unit power billing. Power Utilities' new, smart (communicating) power meters, which utilizes advanced metering infrastructure (AMI) and advanced meter reading (AMR) technology to transmit and receive power usage data and billing/rate data to their billing information system, will communicate directly to the intelligent circuit breaker (ICB) via an embedded transceiver (e.g., powerline or RF modem) in the smart meter. The Utility is then able monitor power and control the ICB functions.

2) Alternatively, a powerline or RF modem connection (e.g., computer interface module) to a computer and or a gateway (Internet or LAN/WAN) would allow a user or Utility to access the secure network and the ICB. The ICB can be used to calculate functions for power measurements and billing rates, schedule load control for one or more devices, as well as perform diagnostics for power quality monitoring. A secondary application is to install and use other smart networked devices in the home or building (e.g., thermostats, occupancy/motion sensors, lighting/appliance devices, security and safety systems) to create a no host peer-to-peer (P2P) network in automating a home for energy management, load scheduling, convenience and safety. The system does not require a host computer and can be added to a home or building for user convenience and control, whether local or remote.

Figure 7C:
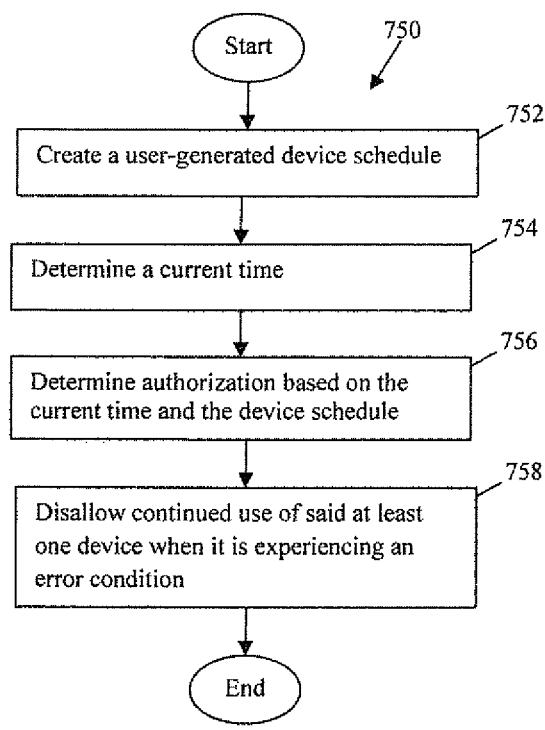
FIG. 7c is a block diagram illustrating an exemplary method of scheduling operation of a plurality of powered devices associated with a circuit breaker.

FIG. 7c illustrates an exemplary method of scheduling operation of a plurality of powered devices associated with a circuit breaker according to the present invention and as discussed elsewhere herein.

It will be recognized that while certain aspects of the invention are described in terms of a specific sequence of steps of a method, these descriptions are only illustrative of the broader methods of the invention, and may be modified as required by the particular application. Certain steps may be rendered unnecessary or optional under certain circumstances. Additionally, certain steps or functionality may be added to the disclosed embodiments, or the order of performance of two or more steps permuted. All such variations are considered to be encompassed within the invention disclosed and claimed herein.

While the above detailed description has shown, described, and pointed out novel features of the invention as applied to various embodiments, it will be understood that various omissions, substitutions, and changes in the form and details of the device or process illustrated may be made by those skilled in the art without departing from the invention. The foregoing description is of the best mode presently contemplated of carrying out the invention. This description is in no way meant to be limiting, but rather should be taken as illustrative of the general principles of the invention. The scope of the invention should be determined with reference to the claims.

What is claimed is:

1. A method of scheduling operation of a plurality of powered devices associated with a circuit breaker, said method comprising:
    enabling a user to enter one or more parameters to create a user-generated device schedule, said user-generated device schedule indicating first and second ones of said plurality of powered devices that are authorized for use during first and/or second time ranges, said first ones of said plurality of powered devices not being authorized for use during said first time range, and said second ones of said plurality of powered devices being authorized for use during both said first and said second time ranges;
    determining a current time; and
    managing functioning of at least one powered device based at least in part on said user-generated device schedule, and said current time, said managing functioning comprising;
        determining whether said at least one powered device is authorized for use during said current time based at least in part on whether said at least one powered device is within said first ones or said second ones of said plurality of powered devices, and whether said current time is within said first or said second time range;
        when it is determined that said at least one powered device is authorized for use during said current time, periodically evaluating a plurality of power data associated with use of said at least one powered device to generate an operating power signature for comparison to a calibration power signature characteristic of a properly functioning device;
        alerting said user that said at least one powered device is experiencing an error condition when said comparison of said operating and calibration power signatures indicates a change that satisfies a first criteria;
        providing a suggested cause of said error condition of said at least one powered device based upon said comparison; and
        disallowing continued use of said at least one powered device when it is experiencing said error condition.

2. The method of claim 1, wherein at least one of said first and second time ranges comprises at least one of a pre-set time range or a user-entered time range; and
wherein said user-entered time range is configured to be entered by at least one user via a user device in secure data communication with said circuit breaker.

3. The method of claim 1, further comprising at least one mechanism for determining said current time, said at least one mechanism comprising at least one of a real-time clock, or a periodically updated software clock.

4. The method of claim 1, wherein said managing functioning further comprises:
    preventing said at least one powered device from receiving power when said current time is within said first time range and said at least one powered device is within said first ones of said plurality of powered devices; and
    permitting said at least one powered device to receive power when said current time is within said second time range and said at least one powered device is within said first ones of said plurality of powered devices.

5. The method of claim 4, wherein said preventing said at least one powered device from receiving power comprises causing interruption of a circuit via manipulation of one or more mechanical components effecting circuit breaking function resident within said circuit breaker, and wherein said permitting said at least one powered device to receive power comprises causing completion of a circuit via manipulation of at least one mechanical component effecting circuit breaking function resident within said circuit breaker.

6. The method of claim 1, wherein said managing functioning of said at least one powered device further comprises permitting said at least one powered device to receive power when said current time is within said first or said second time range and said at least one powered device is within said second ones of said plurality of powered devices.

7. A method of operating a plurality of powered devices associated with a circuit breaker, said method comprising:
    determining a current time as being within a first or a second time range;
    obtaining a schedule, said schedule indicating authorized use of each of said plurality of powered devices during at least said first and/or said second time range, said schedule indicating whether individual ones of said plurality of powered devices comprise first or second tier devices, said first tier devices not being authorized for use during said first time range, and said second tier devices being authorized for use during both said first and said second time ranges; and
    controlling operation of at least one of said plurality of powered devices based at least in part on:
        determining whether said at least one powered device is within said first or said second tier devices and whether said current time is within said first and/or second time range and therefore authorized for use at said current time;
        comparing a first power signature comprising a plurality of power data associated with use of said at least one powered device to a second power signature comprising a plurality of power data characteristic of a properly functioning device;
        alerting a user that said at least one powered device is not functioning properly when said comparison indicates a difference that satisfies a first criteria;
        providing to said user information relating to a cause of said improper functioning based at least in part upon said comparison; and
        indicating at least one maintenance activity to be performed on said at least one powered device based at least in part upon said comparison.

8. The method of claim 7, wherein said obtaining a schedule comprises enabling a user to enter said first and second time ranges.

9. The method of claim 7, wherein said determining a current time comprises using at least one of a real-time clock or a periodically updated software clock.

10. The method of claim 7, wherein said controlling operation further comprises utilizing one or more mechanical components to prevent an individual one of said plurality of powered devices from receiving power when said current time is within said first time range and said individual one of said plurality of powered devices is within said first tier devices.

11. The method of claim 10, wherein said one or more mechanical components prevent said individual one of said plurality of powered devices from receiving power by causing interruption of a circuit via manipulation of said one or more mechanical components.

12. The method of claim 7, wherein said controlling operation further comprises utilizing one or more mechanical components to permit an individual one of said plurality of powered devices to receive power when said current time is within said second time range and said individual one of said plurality of powered devices is within said first tier devices.

13. The method of claim 12, wherein said permitting said individual one of said plurality of powered devices to receive power comprises causing completion of a circuit via manipulation of said one or more mechanical components.

14. A method of scheduling operation of a plurality of powered devices associated with a circuit breaker, said method comprising:
enabling a user to enter one or more parameters to create a multi-tier device schedule, said multi-tier device schedule indicating individual ones of said plurality of powered devices as being either a first or a second tier device, said first tier devices comprising devices not being authorized for use during a first time range, and said second tier devices comprising devices being authorized for use during both said first time range and a second time range;
determining a current time; and
managing functioning of at least one powered device based at least in part on said multi-tier device schedule and said current time, said managing functioning comprising:
determining whether said at least one powered device is authorized for use during said current time based at least in part on whether said at least one powered device is within said first or second tier devices, and whether said current time is within said first or second time range;
periodically evaluating a plurality of power data associated with use of said at least one powered device to generate an operating power signature;
comparing said operating power signature to a calibration power signature;
when said comparison indicates a threshold level of difference indicative of an error condition, providing to said user a description of a cause of said error condition; and
disallowing continued use of said at least one powered device when said at least one device when it is experiencing an error condition.

15. The method of claim 14, wherein said power data comprises at least one of watt-hours, voltage, frequency, temperature, and power factor data.

16. The method of claim 14, wherein said operating power signature comprises an normalized or averaged power signature determined over at least one of a daily or seasonal basis.

17. The method of claim 15, wherein said calibration power signature comprising a factory preset power signature.

18. The method of claim 14, further comprising storing information relating to said first and second time ranges.

19. The method of claim 18, further comprising enabling said user to enter said first and second time ranges via at least one user input at a user device.

20. The method of claim 14, wherein said managing functioning further comprising preventing said at least one powered device from receiving power when said current time is within said first time range and said at least one powered device is within said first tier devices, and said preventing comprises causing interruption of a circuit via manipulation of one or more mechanical components effecting circuit breaking function resident within said circuit breaker.

21. The method of claim 14, wherein said managing functioning further comprising causing said at least one powered device to receive power when said current time is within said second time range and said at least one powered device is within said first tier devices, said causing comprises causing completion of a circuit via manipulation of at least one mechanical component effecting circuit breaking function resident within said circuit breaker.

* * * * *